United States Patent
Kudo et al.

(10) Patent No.: US 7,470,602 B2
(45) Date of Patent: Dec. 30, 2008

(54) CRYSTALLINE FILM AND ITS MANUFACTURE METHOD USING LASER

(75) Inventors: Toshio Kudo, Tokyo (JP); Kouji Seike, Yokosuka (JP); Kazunori Yamazaki, Zushi (JP)

(73) Assignee: Sumitomo Heavy Industries, LTD., Tokyo (JP)

( * ) Notice: Subject to any disclaimer, the term of this patent is extended or adjusted under 35 U.S.C. 154(b) by 359 days.

(21) Appl. No.: 11/097,346

(22) Filed: Apr. 4, 2005

(65) Prior Publication Data

US 2005/0189542 A1   Sep. 1, 2005

Related U.S. Application Data

(63) Continuation of application No. PCT/JP03/13141, filed on Oct. 14, 2003.

(30) Foreign Application Priority Data

Oct. 29, 2002   (JP)   ............................. 2002-314735

(51) Int. Cl.
   *H01L 21/20*   (2006.01)
   *H01L 21/36*   (2006.01)
(52) U.S. Cl. ........................ 438/487; 438/197; 438/463; 438/488; 257/E21.17; 257/E21.051; 257/E21.347; 257/E21.475; 257/E21.562
(58) Field of Classification Search ................. 438/487, 438/488, 197, 96, 97, 289, 308, 365, 263, 438/535, 564, 680, 463
See application file for complete search history.

(56) References Cited

U.S. PATENT DOCUMENTS 5,815,494 A   9/1998   Yamazaki et al.
5,936,291 A * 8/1999   Makita et al. ................ 257/405
5,981,974 A * 11/1999  Makita ........................ 257/72

(Continued)

FOREIGN PATENT DOCUMENTS

CN          1304548         7/2001

(Continued)

OTHER PUBLICATIONS

Chinese Office Action application No. 200380102421.5 dated Apr. 6, 2007.

(Continued)

*Primary Examiner*—David Nhu
(74) *Attorney, Agent, or Firm*—Squire, Sanders & Dempsey L.L.P.

(57) ABSTRACT

A workpiece object is prepared which has a thin film on the surface and made of amorphous material. A pulse laser beam is applied to the thin film, the pulse laser beam having an elongated beam cross section along one direction on the surface of the thin film. With this pulse laser beam, the thin film is melted and thereafter the thin film is solidified to form crystal grains framing chains along a long axis direction of a beam incidence region in first stripe regions. The first stripe regions extend along the long axis direction in regions of the beam incidence region between its center line and borders of the beam incidence region extending along the long axis direction, and are spaced apart from the borders and the center line by a predetermined distance.

6 Claims, 15 Drawing Sheets

U.S. PATENT DOCUMENTS

| | | | |
|---|---|---|---|
| 6,020,224 A * | 2/2000 | Shimogaichi et al. | 438/158 |
| 6,372,039 B1 | 4/2002 | Okumura | |
| 6,423,127 B1 | 7/2002 | Miyamoto et al. | |
| 6,566,683 B1 * | 5/2003 | Ogawa et al. | 257/53 |
| 6,573,161 B1 | 6/2003 | Miyasaka et al. | |
| 6,753,548 B2 | 6/2004 | Ogawa et al. | 257/53 |
| 2001/0001745 A1 | 5/2001 | Im et al. | |
| 2001/0041426 A1 | 11/2001 | Im | |
| 2002/0045288 A1 | 4/2002 | Yamazaki et al. | |
| 2002/0132402 A1 | 9/2002 | Tankaka et al. | |
| 2003/0032222 A1 | 2/2003 | Okumura | |

FOREIGN PATENT DOCUMENTS

| | | |
|---|---|---|
| EP | 0 999 244 A1 | 5/2000 |
| EP | 1 083 590 A1 | 3/2001 |
| EP | 1 087 429 A1 | 3/2001 |
| JP | 09-219380 | 8/1997 |
| JP | 11-274095 | 10/1999 |
| JP | 2000-505241 | 4/2000 |
| JP | 2000-260731 | 9/2000 |
| JP | 2000-286195 | 10/2000 |
| JP | 2000-286211 | 10/2000 |
| JP | 2001-035806 | 2/2001 |
| JP | 2001-044135 | 2/2001 |
| JP | 2001-274088 | 10/2001 |
| JP | 2002-270510 | 9/2002 |
| JP | 2002-280302 | 9/2002 |
| JP | 2003-528461 | 9/2003 |
| KR | 2001-0043343 | 5/2001 |
| WO | WO 00/54313 | 9/2000 |
| WO | WO 00/54314 | 9/2000 |
| WO | WO 01/71786 | 9/2001 |

OTHER PUBLICATIONS

Official Communication issued in the corresponding Japanese Patent Application No. 2004-548019, mailed on May 27, 2008. (With English translation).

Ryoichi Ishihara et al.; "A Novel Double-Pulse Excimer-Laser Crystallization Method of Silicon Thin-Films"; Jpn. J. Appl. Phys.; vol. 34; pp. 3976-3981; Part 1; No. 8A; Aug. 1995.

* cited by examiner

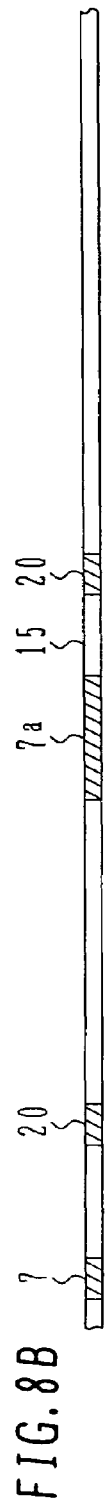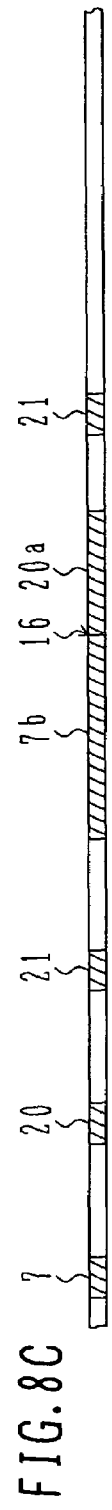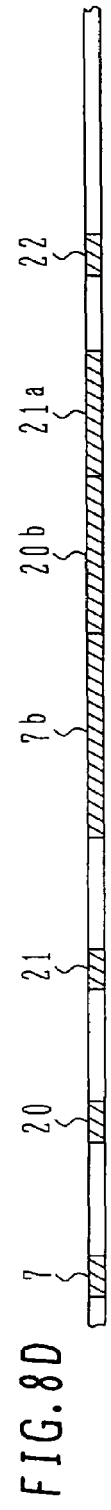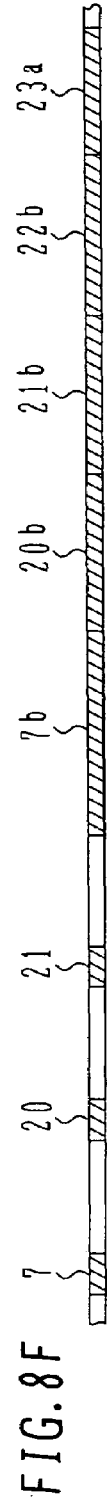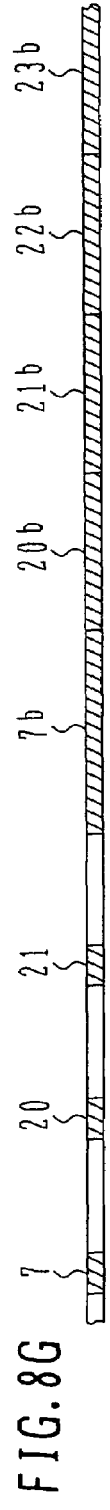

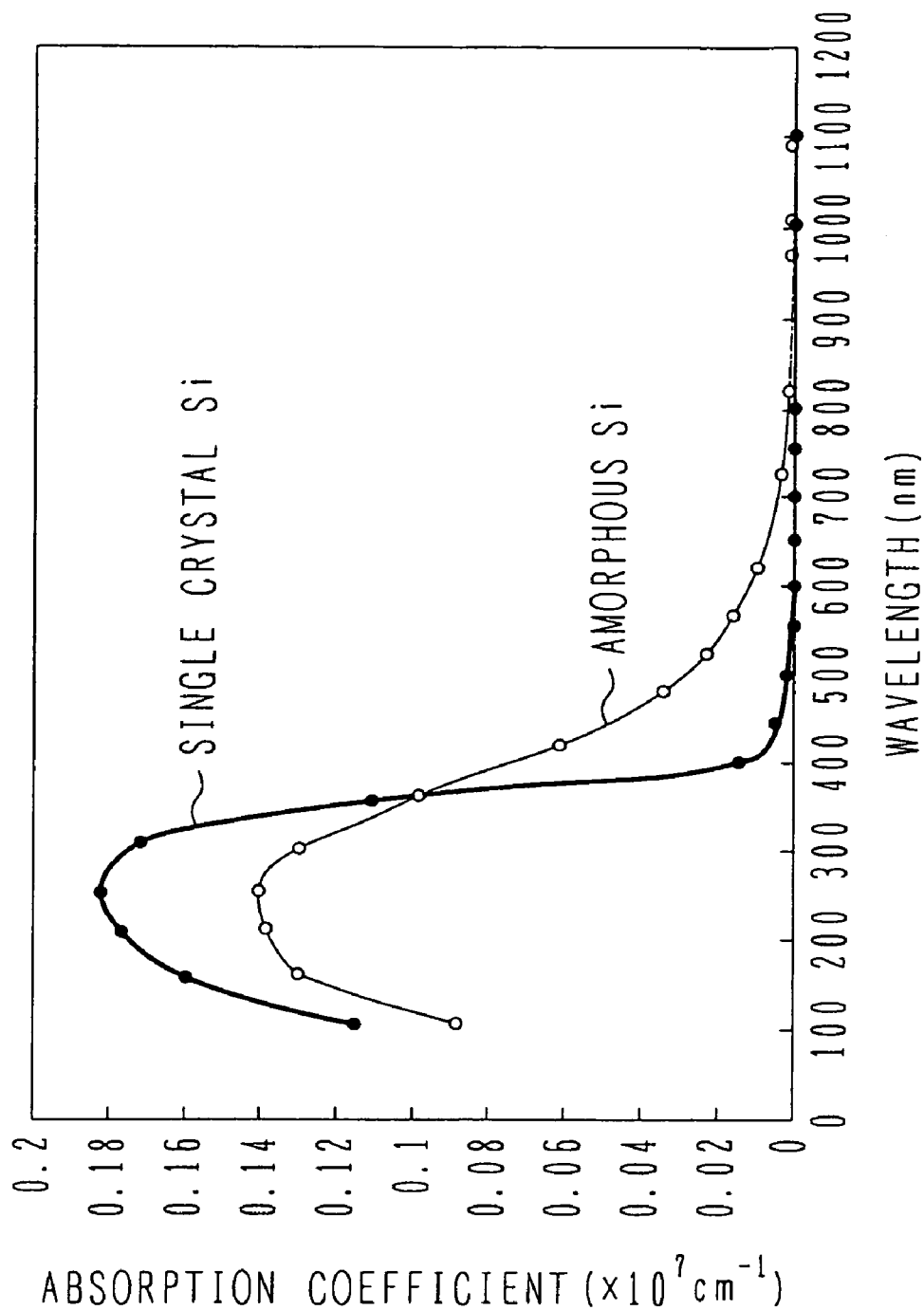

CRYSTALLINE FILM AND ITS MANUFACTURE METHOD USING LASER

CROSS REFERENCE TO RELATED APPLICATION

This application is a Continuation Application of PCT/JP2003/013141 filed on Oct. 14, 2003, the entire contents of which are incorporated herein by reference.

The application PCT/JP2003/013141 is based on and claims priority of Japanese Patent Application No. 2002-314735 filed on Oct. 29, 2002, the entire contents of which are incorporated herein by reference.

FIELD OF THE INVENTION

The present invention relates to a crystalline film manufacture method and a crystalline film, and more particularly to a manufacture method for a crystalline film crystallized by irradiating a laser beam to an amorphous film, and a crystalline film manufactured by this method.

A crystalline film can be used with a low temperature type polycrystalline TFT liquid crystal display, a solar battery panel, a paper type liquid crystal display, an organic EL display and the like.

PRIOR ART

Sequential lateral solidification (SLS) techniques are known wherein an excimer laser is applied to an amorphous silicon thin film to repetitively melt and solidify it and grow crystals in a lateral direction (in-plane direction of the thin film). Conventional SLS techniques will be described in detail.

After the cross section of a pulse laser beam is made elongated, the pulse laser beam is passed through a slit, e.g., about 3 to 30 μm wide and 100 μm long. The pulse laser beam passed through the slit is guided into an optical focusing system, which focuses the slit upon the surface of an amorphous silicon thin film. The pulse laser beam becomes incident upon the amorphous silicon film. A magnification factor of this optical focusing system is ⅓ for example. The radiated region of the laser beam on the surface of the amorphous silicon film has the width of about 1 to 10 μm and the length of about 33 μm. The beam intensity distribution of the irradiated region is approximately rectangular along the width direction.

As the laser beam becomes incident upon the amorphous silicon film, amorphous silicon melts. Since a cooling velocity near the border of a melted region is faster than that inside the melted region, solidification starts near the border. The solidified region becomes a nucleus so that crystal grows from this nucleus toward the inside of the melted region. Since the crystal growth starts at both borders on the longer sides of the irradiated region, a grain boundary between crystal grains grown starting from the both borders is formed near the center of the irradiated region along its width direction.

A second pulse laser beam is applied by moving the pulse laser beam incidence region along the width direction by about 50% of the width. A region on one side of the grain boundary formed near the center of the irradiated region by the first pulse laser beam is melted again. The crystal grains in the region not melted again become seed crystals so that crystal grows in the re-melted region.

By repeating the laser exposure while the incidence region of the pulse laser beam is moved, crystals can be grown along the motion direction of the irradiating direction.

The documents 1-3 mentioned below disclose the techniques in which a second harmonic wave of Nd:YAG laser is used, the beam cross section is shaped linearly, and the laser beam is applied to an amorphous silicon layer to grow crystals along a lateral direction. The documents 4 and 5 mentioned below disclose the techniques in which excimer laser is used and the laser beam is applied to an amorphous silicon layer via a patterned mask to grow crystals along a lateral direction.

(Document 1) JPA-2000-260731
(Document 2) JPA-2000-286195
(Document 3) JPA-2000-286211
(Document 4) JPA-2000-505241
(Document 5) JPA-2001-274088

Techniques of forming larger crystal grains have been desired to date. An object of the present invention is to provide a novel technique of laterally growing crystals.

SUMMARY OF THE INVENTION

According to one aspect of the present invention, there is provided a polycrystalline film manufacture method comprising steps of: (a) preparing a workpiece object having a thin film formed on a surface of the workpiece object and made of amorphous material; (b) applying a pulse laser beam to the thin film to melt the thin film, the pulse laser beam having an elongated beam cross section along one direction on a surface of the thin film, and thereafter solidifying the thin film to form crystal grains in first stripe regions extending along a long axis direction of a beam incidence region, the first stripe regions being placed in regions of the beam incidence region between its center line and borders of the beam incidence region extending along the long axis direction, and being spaced apart from the borders and the center line by a distance, the crystal grains framing chains along the long axis direction.

According to another aspect of the present invention, there is provided a polycrystalline film manufacture method comprising steps of: (i) preparing a workpiece object having a thin film formed on a surface of the workpiece object and made of amorphous material; and (j) applying a pulse laser beam to the thin film to melt the thin film, the pulse laser beam having an elongated beam cross section along one direction on a surface of the thin film, and thereafter solidifying and polycrystallizing the thin film, the pulse laser beam being applied under conditions that crystal grains are generated in a first stripe regions defined by a center line of the beam incidence region and virtual lines spaced apart by a distance from borders of the beam incidence region extending along the long axis direction, the crystal grains framing chains along the long axis direction, and that the crystal grains generated in the first stripe region on one side of the center line come in contact with the crystal grains generated in the first stripe region on another side of the center line, wherein a gradient of a pulse energy density of the pulse laser beam along a short axis direction of the beam incidence region is equal to or smaller than 280 mJ/cm$^2$/μm at an outer border of each of the first stripe regions extending along the long axis direction.

According to another aspect of the present invention, there is provided a polycrystalline film manufacture method comprising steps of: (p) preparing a workpiece object having a thin film formed on a surface of the workpiece object and made of amorphous material; and (q) applying a pulse laser beam to the thin film to melt the thin film, the pulse laser beam having an elongated beam cross section along one direction on a surface of the thin film, and thereafter solidifying and polycrystallizing the thin film, the pulse laser beam having a beam profile that a gradient of a pulse energy density of the pulse laser beam is 280 mJ/cm²/μm or smaller at a border of a melted region. Large crystal grains can be obtained by irradiating pulse laser beam under the above mentioned condition.

BRIEF DESCRIPTION OF THE DRAWINGS

FIG. 8 is a schematic cross sectional view of a thin film in the middle of the manufacture by a polycrystalline film manufacture method according to the second embodiment.

FIG. 11 is a graph showing the wavelength dependency of absorption coefficients of single crystal silicon and amorphous silicon.

PREFERRED EMBODIMENTS

Figure 1:
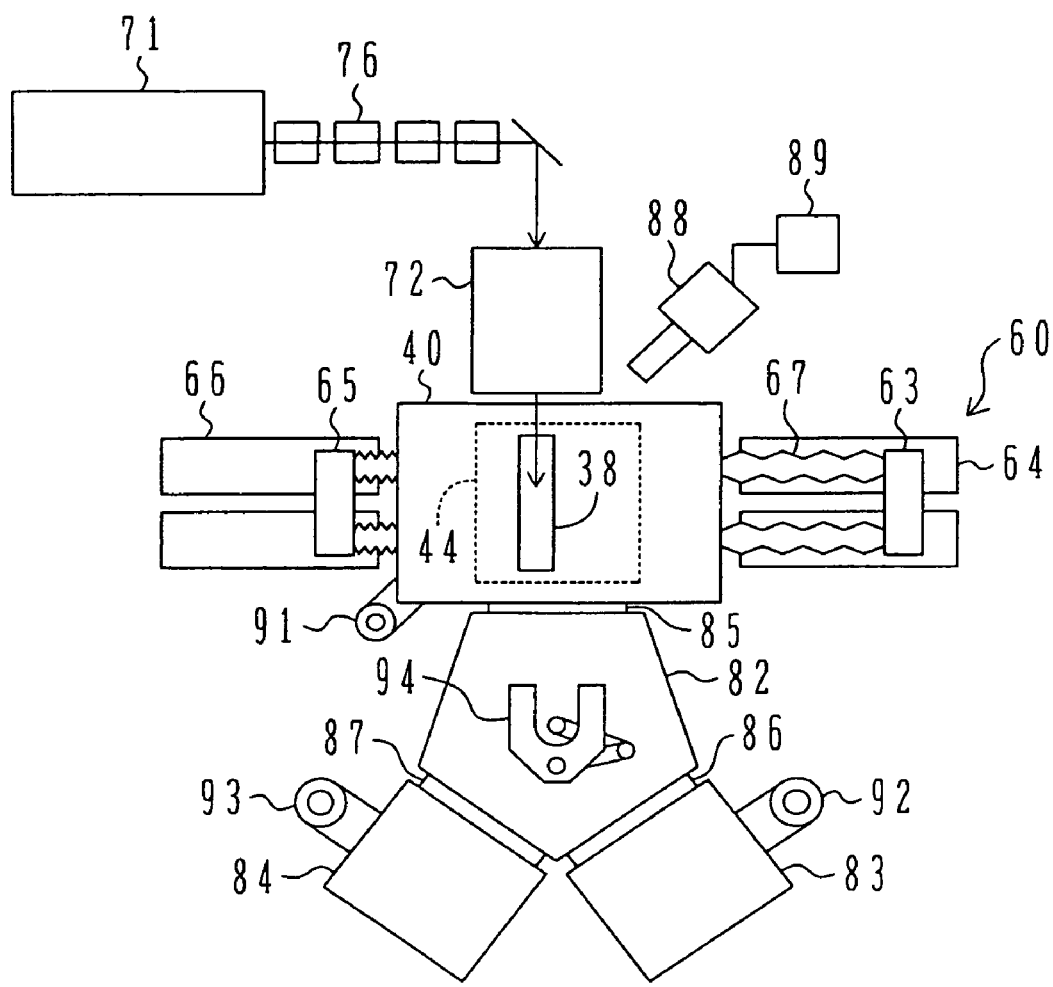
FIG. 1 is a schematic plan view of a laser annealing system used by the embodiments of the invention.

FIG. 1 shows a schematic diagram of a laser annealing system used by the embodiments of the present invention. The laser annealing system comprises a process chamber 40, a convey chamber 82, transport chambers 83 and 84, a laser source 71, a homogenizer 72, a CCD camera 88 and a video monitor 89. A direct motion mechanism 60 is mounted on the process chamber 40, including a bellows 67, coupling members 63 and 65, a linear guide mechanism 64, a linear motor 66 and the like. The direct motion mechanism 60 can make a stage 44 disposed in the process chamber 40 be subjected to translation motion.

The process chamber 40 and convey chamber 82 are coupled by a gate valve 85, the convey chamber 82 and transport chamber 83 are coupled by a gate valve 86, and the convey chamber 82 and transport chamber 84 are coupled by a gate valve 87. The process chamber 40 and transport chambers 83 and 84 are installed with vacuum pumps 91, 92 and 93, respectively, to allow the inside of each chamber to be evacuated. A convey robot 94 is accommodated in the convey chamber 82.

The convey robot 94 conveys a workpiece object substrate between any two chambers of the process chamber 40 and transport chambers 83 and 84.

A laser beam transmission quartz window 38 is formed through the top wall of the process chamber 40. Instead of quartz, visual optical glass such as BK7 may be used. A pulse laser beam output from the laser source 71 enters an attenuator 76 and is input to the homogenizer 72. The homogenizer 72 shapes the cross section of the laser beam into an elongated shape and also homogenizes the intensity of the laser beam along its longitudinal axis. The laser beam passed through the homogenizer 72 transmits through the elongated quartz window 38 having a shape corresponding to the beam cross section, and becomes incident upon a substrate held on a stage 44 in the process chamber 40. The relative position of the homogenizer 72 and substrate is adjusted so as to make the substrate surface be coincident with the homogenized plane.

The translation motion direction of the stage 44 driven by the direct motion mechanism 60 is perpendicular to the longitudinal direction of the quartz window 38. It is therefore possible to apply a laser beam to a broad area of the substrate surface and polycrystallize an amorphous semiconductor film formed on the substrate surface. The substrate surface is photographed with the CCD camera 88 so that the substrate surface under processing can be observed on a video monitor 89.

The polycrystalline film manufacture method of the first embodiment will be described with reference to FIGS. 2A and 2B and FIG. 3.

Figure 2A:
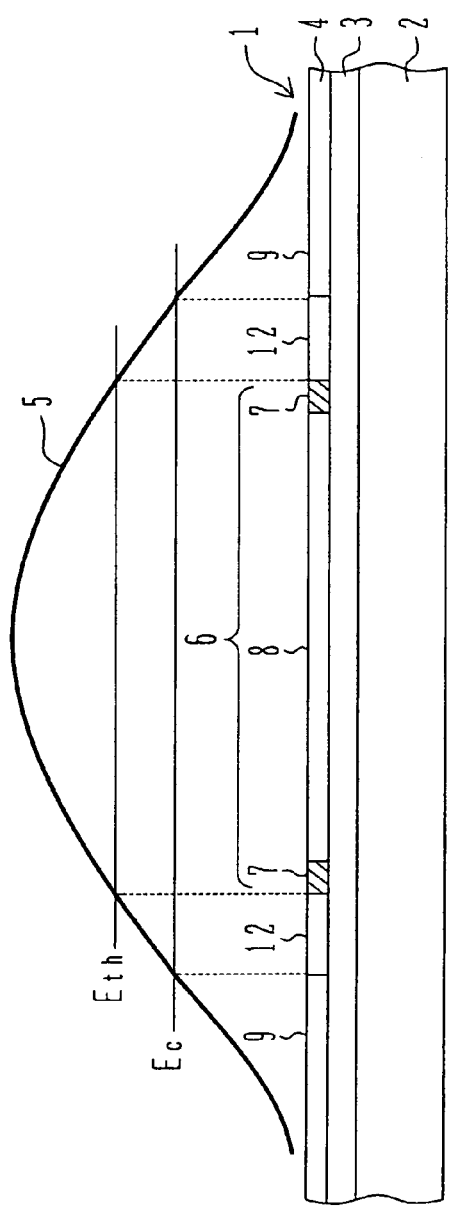
FIG. 2A is a cross sectional view of a workpiece object and a graph showing the pulse energy density distribution, on the workpiece object surface, of a pulse laser used by the first embodiment.

FIG. 2A is a cross sectional view of a workpiece sample 1 and a graph showing the pulse energy density distribution, on the surface of the workpiece object 1, of a laser beam along a short axis direction. The workpiece object 1 has a three-layer structure constituted of: a glass substrate 2 of 0.7 mm thick; a silicon oxide film 3 of 100 nm thick covering the surface of the glass substrate; and an amorphous silicon film 4 of 50 nm thick formed on the silicon oxide film. The silicon oxide film 3 is formed, for example, by chemical vapor deposition (CVD) or sputtering. The amorphous silicon film 4 is formed, for example, by low pressure CVD (LP-CVD) or plasma enhanced CVD (PE-CVD).

A pulse energy density distribution 5 in a beam cross section along the short axis direction can be approximated by the Gaussian distribution. The amorphous silicon film 4 is completely melted in a region 6 applied to which is a laser beam having a pulse energy density equal to or higher than a threshold value Eth at which amorphous silicon can be melted completely. The word "completely" is intended to mean that the silicon film is melted over the whole thickness.

The silicon film is partially melted in a region 12 outside the region 6 between the pulse energy densities of the threshold value Eth and a value Ec. The word "partially" is intended to mean that although a portion of the silicon film is melted, a portion not melted and remaining in the amorphous phase also exists. The amorphous silicon film 4 is not melted in a region 9 outside a position having the pulse energy of Ec. When melted silicon is solidified, silicon crystal grains are formed.

The present inventor has found the following phenomenon. Relatively large crystal grains are formed in stripe regions 7 near the position at the pulse energy density threshold value of Eth, fine crystal grains are formed in a region 8 inside the stripe regions 7, and crystal grains are randomly distributed in regions 12, the crystal grains in regions 12 having an intermediate size between the size of the crystal grains in the region 8 and the size of the crystal grains in the region 7. The phrase "the size of a crystal grain" is intended to mean an average size of crystal grains distributed in each region.

Figure 2B:
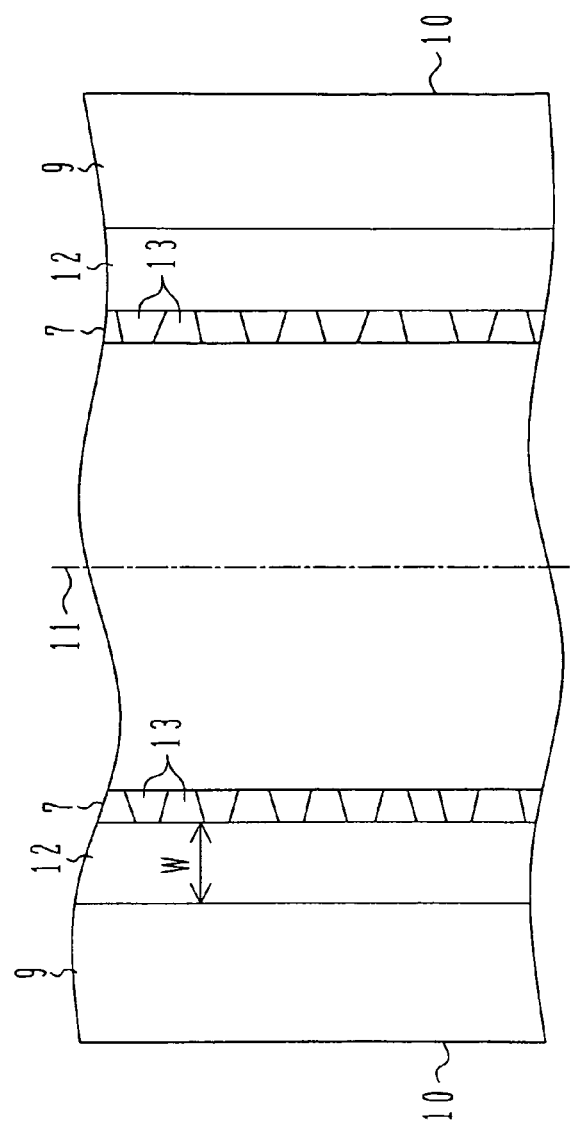
FIG. 2B is a schematic plan view of a polycrystallized workpiece object.

FIG. 2B shows a schematic plan view of the regions to which the pulse laser beam is applied. The vertical direction in FIG. 2B corresponds to the long axis of the beam incidence region. The stripe regions 7 are disposed between the centerline 11 and the borders 10 extending along the long axis of the beam incidence region. The stripe region 7 is disposed spaced apart by some distance from the border 10 of the beam incidence region. A number of crystal grains 13 are formed and frame chains along the long axis direction.

The intensity distribution of the pulse laser beam along the short axis direction can be approximated by the Gaussian distribution. A half value width of the intensity distribution along the short axis is herein called a beam width. The beam components corresponding to the skirt portions of the Gaussian distribution are actually applied also to both outer sides of the region corresponding to the beam width on the workpiece object surface. The border 10 of the beam incidence region can be defined, for example, as the position at which the pulse energy density becomes 10% of the maximum value.

Figure 3:
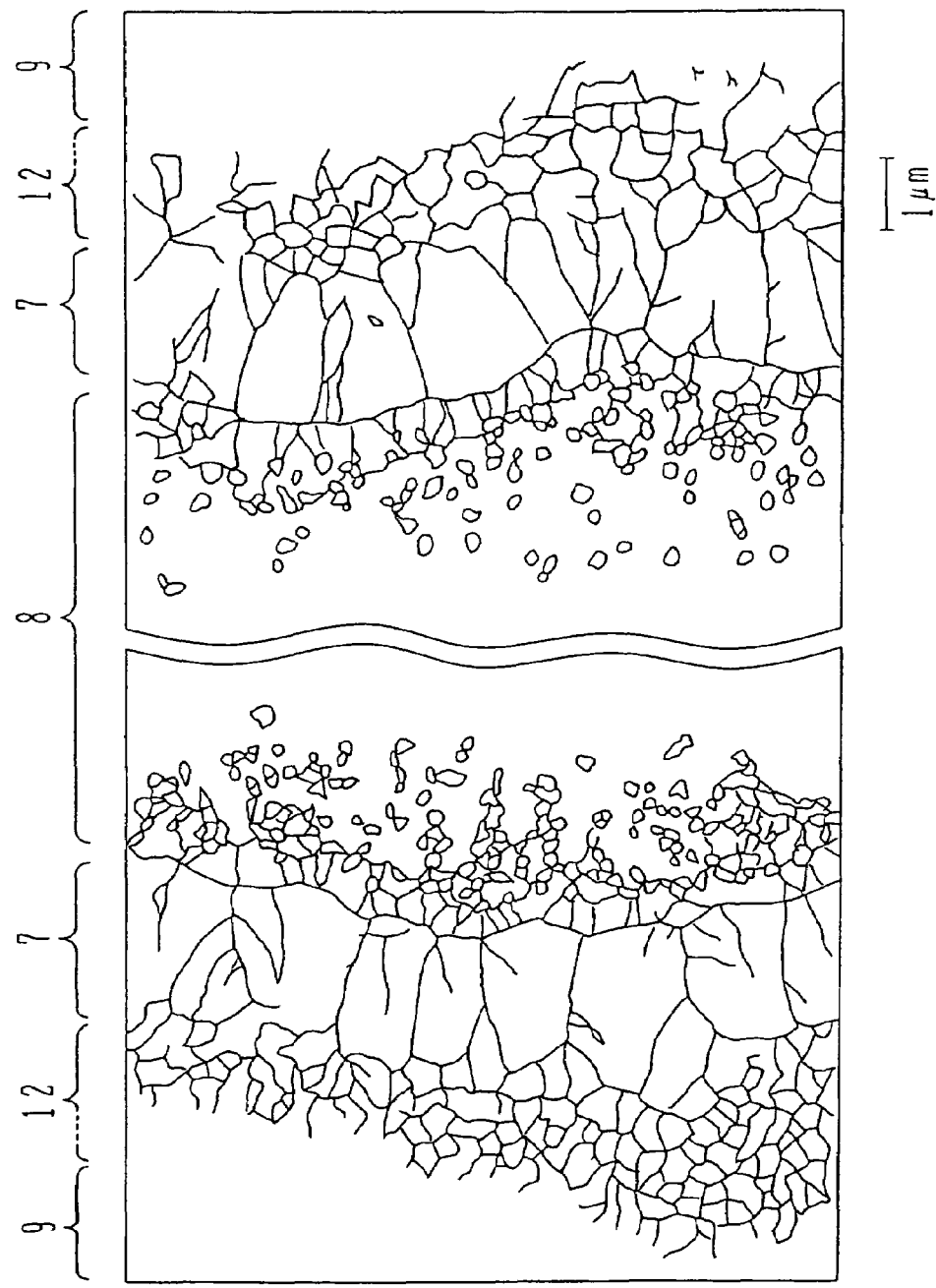
FIG. 3 is a diagram sketched from a SEM photograph of a polycrystalline film manufactured by the method according to the first embodiment.

FIG. 3 is a diagram sketched from a scanning electron microscope photograph (SEM photograph) of a polycrystallized silicon film. The incidence pulse laser beam is the second harmonic wave (wavelength of 527 nm or 524 nm) of Nd:YLF laser and its pulse width is 100 ns. A length of the beam cross section along the long axis direction is 5 mm on the workpiece object surface, and the beam width is 0.2 mm. Two pulse laser beams were applied to the same region at the same time, having the pulse energy density of 500 mJ/cm$^2$ on the surface of the workpiece object. The effective pulse energy density is therefore 1 J/cm$^2$. The pulse energy density was calculated by dividing the pulse energy by an area of a beam cross section on the workpiece object surface.

It can be seen that relatively large crystal grains are formed in the stripe region 7, the large crystal grains framing chains along the long axis direction. The length of each crystal grain is about 1.5 to 2 μm along the short axis direction and about 0.7 to 1.5 μm along the long axis direction. A number of fine crystal grains are formed in the region 8 between the two stripe regions 7.

It can be seen that in the regions 12 outside the stripe regions 7, crystal grains are randomly disposed having the size larger than that of the fine crystal grains in the region 8 and smaller than that of the crystal grains in the stripe regions 7. The regions 9 outside the randomly distributed grain regions 12 remain in the amorphous phase. By observing with a microscope, the borders between these regions can be detected as a color difference.

Next, description will be made on the studies of the mechanism that how crystal grains having various sizes shown in FIG. 3 are formed.

Figure 4A:
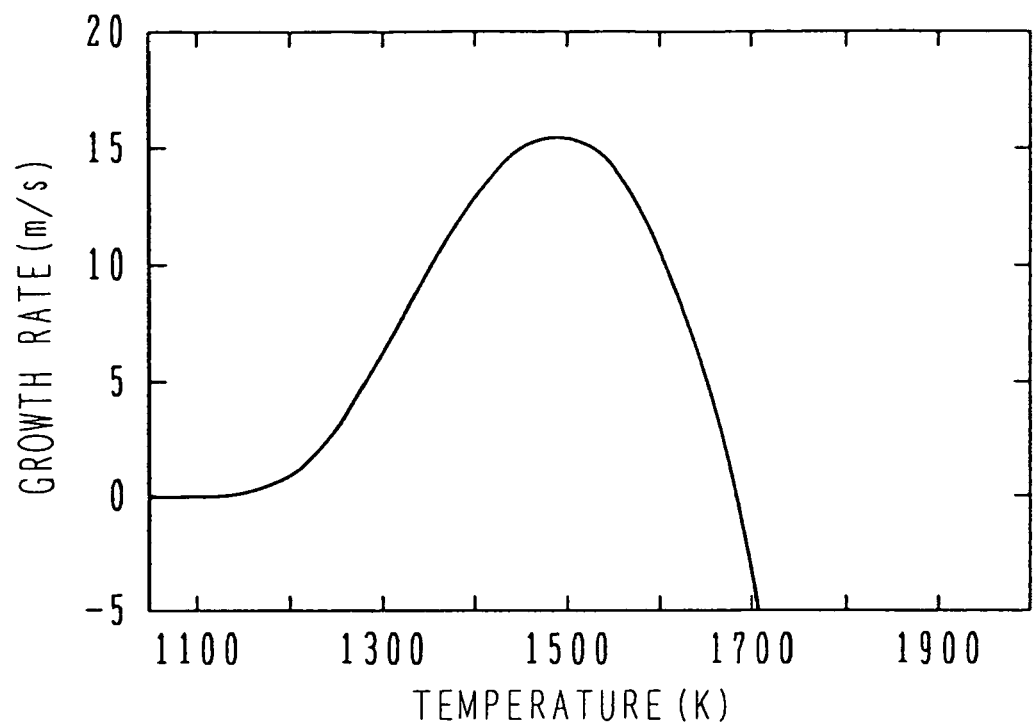
FIG. 4A is a graph showing the relation between a temperature of melted silicon and a crystal growth velocity.
Figure 4B:
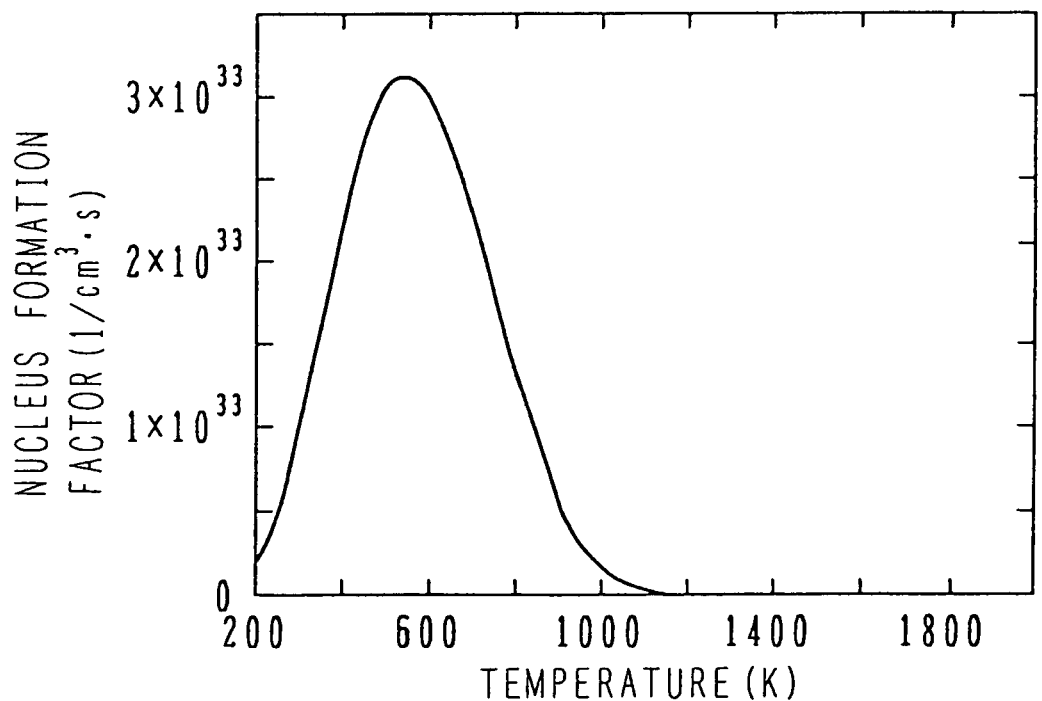
FIG. 4B is a graph showing the relation between a temperature and a nucleus formation factor.

FIG. 4A shows the temperature dependency of a growth velocity of silicon crystals, and FIG. 4B shows the temperature dependency of a formation factor of nuclei for crystal growth. The ordinate of FIG. 4A represents the growth velocity in the unit of "m/s", the ordinate of FIG. 4B represents the nucleus formation factor in the unit of "1/cm$^3$·s", and the abscissas of FIGS. 4A and 4B represent the temperature in the unit of "K". The graphs shown in FIGS. 4A and 4B were formed by using the approach of "Micro Analysis of Dynamic Crystal Growth Process of Polycrystal" by Daiji ICHISHIMA (Sumitomo Heavy Industries, Ltd) written in the materials of the 21st FEM seminar, vol. 22, pp. 27-32, the Simulation Integration System Sectional Committee, The Japan Society for Technology of Plasticity, Jul. 14, 1999.

As shown in FIG. 4A, the growth velocity is 0 at the melting point (1683 K) of single crystal silicon, and as the temperature lowers, the growth velocity increases. Near at a temperature of 1500 K, the growth velocity takes the maximum value. Therefore, the lower the temperature of melted silicon, the faster the growth velocity. The growth velocity also depends on the temperature gradient at the interface between the solid phase and liquid phase, and the steeper the temperature gradient, the faster the growth velocity.

As shown in FIG. 4B, the nucleus formation factor becomes large as the temperature lowers from the silicon melting point, and takes the maximum value near at the temperature of 600 K.

The stripe region 7 shown in FIG. 3 is considered having a proper temperature capable of providing a low nucleus formation factor and a high growth velocity and a proper temperature gradient at the solid-liquid interface. The region 12 between the stripe region 7 and amorphous region 9 is considered having a high nucleus formation factor because of a lower temperature than that of the stripe region 7 and a slower growth velocity because of a gentle temperature gradient at the solid-liquid interface. It can be considered that crystal grains in this region cannot become large because a number of nuclei are formed before the crystal grains grow large.

It can be considered that in the fine crystal region 8, nuclei are formed explosively because of a low temperature and the nucleus formation is more dominant than the growth velocity. As the temperature is lowered to the temperature at which the nucleus formation factor becomes abruptly high, the crystal growth in the stripe region 7 is hindered by newly formed nuclei and the crystal growth stops. The position where the crystal growth stops is considered at the border between the strip region 7 and fine crystal region 8.

More specifically, it can be considered that in the region 12 the crystal growth (heterogeneous growth) from nuclei formed at the interface between the melted layer and the underlying layer becomes dominant, whereas in the fine crystal region 8, the crystal growth (homogeneous growth) from nuclei formed in the melted layer becomes dominant. Large crystal grains are considered to be formed along the border between the heterogeneous growth dominant region and homogeneous growth dominant region.

In order to form large crystal grains, it is necessary that the silicon melting region is set with a proper temperature gradient and temperature providing a fast growth velocity and low nucleus formation factor. If the temperature gradient is steep in the stripe region shown in FIG. 2A, the region where the proper temperature is maintained becomes narrow and large crystal grains are difficult to be formed. In order to form large crystal grains, it is preferable to make the pulse energy density distribution gentle near at the stripe region 7.

If the gradient of the pulse energy density distribution is made too steep, the nucleus formation factor increases. On the other hand, if the gradient of the pulse energy density distribution is made too gentle, the growth velocity lowers. Therefore, it is considered that there is some range where the pulse energy density distribution gradient is neither too steep nor too gentle, in order to set the proper temperature and the proper temperature gradient at the solid-liquid interface providing a fast growth temperature and a low nucleus formation factor.

Next, with reference to FIG. 5, description will be made on the preferable profile of a pulse energy density distribution.

Figures 5A, 5B:
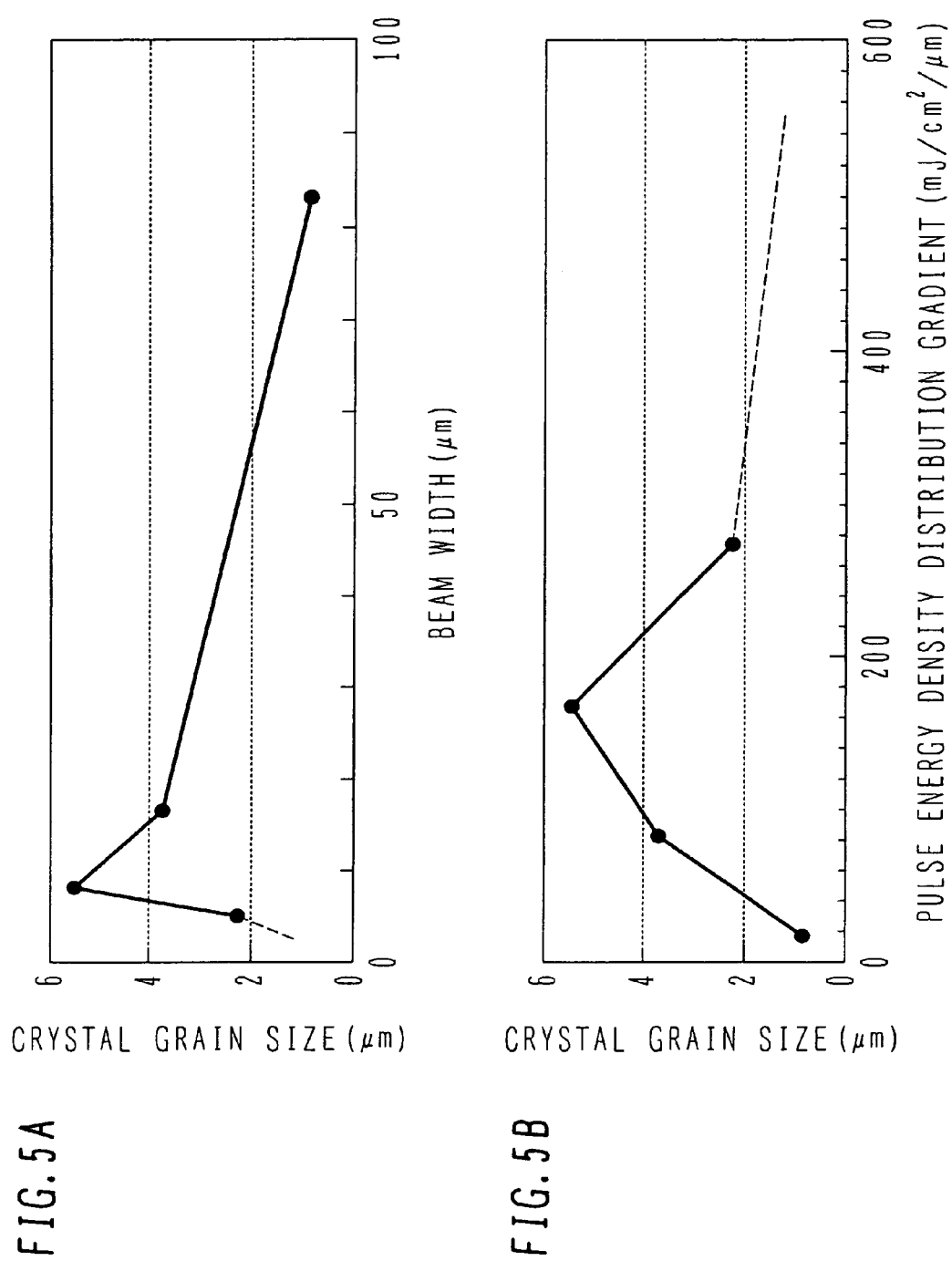
FIG. 5A is a graph showing the relation between the width of a beam cross section and the size of a crystal grain.
FIG. 5B is a graph showing the relation between the gradient of a pulse energy density distribution and the size of a crystal grain.

FIG. 5A shows the relation between a crystal grain size and a beam width on the workpiece object surface. The abscissa represents the beam width in the unit of "μm" and the ordinate represents the crystal grain size in the unit of "μm". The crystal grain size was calculated using a crystal growth evaluation program disclosed in Japanese Patent Laid-open Publication No. 2001-297983.

The workpiece object is a silicon oxide film of 100 nm thick and an amorphous silicon film of 50 nm thick formed on the silicon oxide film.

Simulation was conducted for the region in the beam incidence region having a total width of 6 μm: an 1 μm width outside and a 5 μm width inside the position where the pulse energy density is a half of the peak value, under the conditions of a pulse laser beam wavelength of 527 nm and a pulse width (half value width) of 140 ns. This setting is based upon that the pulse energy density distribution gradient takes approximately the maximum value at the position where the pulse energy density becomes a half of the peak value, and large crystal grains are formed in the region.

The intensity distribution of the beam incidence region along the short axis direction was set to have the Gaussian distribution. Simulation was conducted at various peak intensities for each of the four beam cross section widths of 5.0 μm, 8.3 μm, 16.7 μm, and 83.0 μm. The size of the crystal grain under the conditions that the largest crystal grains are formed, is used as the size of the crystal grain at its beam width. The largest crystal grains were formed under the conditions that the pulse energy density maximum values are 1100 mJ/cm$^2$, 1400 mJ/cm$^2$, 1500 mJ/cm$^2$ and 1500 mJ/cm$^2$, respectively at the beam cross section widths of 5.0 μm, 8.3 μm, 16.7 μm, and 83.0 μm.

FIG. 5B shows the relation between a crystal grain size and a gradient of the pulse energy density distribution at the position where the pulse energy density takes a half of the peak intensity. The graph of FIG. 5B was formed by calculating the pulse energy density distribution gradient at each evaluation point shown in FIG. 5A.

As shown in FIG. 5B, as the pulse energy density distribution increases from 20 mJ/cm$^2$/μm, the crystal grain size increases gradually. This may be ascribed to a faster crystal growth velocity. However, the crystal size takes the maximum value near the pulse energy density distribution gradient of 170 mJ/cm$^2$/μm, and as the gradient becomes larger than that, the crystal grain becomes small. This may be ascribed to that since the pulse energy density gradient becomes steep, the temperature gradient at the solid-liquid interface also becomes steep and the lateral heat dissipation increases the growth velocity. Namely, it is considered that a number of nuclei are formed before the crystals grow large, because a sufficiently long crystal growth time cannot be acquired.

The gradient was 13 mJ/cm$^2$ μm at the position where the pulse energy density was 500 mJ/cm$^2$ when the polycrystalline film shown in FIG. 3 was formed. The size of the crystal grains in the stripe region 7 shown in FIG. 3 is about 1.5 to 2 μm along the short axis direction, which is almost the same as the tendency of the simulation result shown in FIG. 5B. At the gradient of 18 mJ/cm$^2$/μm, the tendency almost the same as the simulation result shown in FIG. 5B was obtained. If the gradient is 10 mJ/cm$^2$ μm or steeper at the position where the pulse energy density is 500 mJ/cm$^2$/μm, the tendency almost the same as the simulation result shown in FIG. 5B is expected to be obtained.

It can be judged from the simulation result shown in FIG. 5B that it is preferable to set the pulse energy density distribution at the position of the stripe region 7 shown in FIGS. 2A and 2B (more strictly, at the outer border of the stripe region 7) to 280 mJ/cm$^2$ μm or gentler, in order to form large crystal grains. It is also preferable to set the gradient to 10 mJ/cm$^2$ μm or steeper. Similar simulation was conducted by using an amorphous silicon film of 100 nm thick, and almost the same tendency as that at the thickness of 50 nm was obtained.

In the first embodiment, as shown in FIG. 2B, the relatively high intensity components of the laser beam in the skirt portions are applied to the region 12 where the crystal grains distribute randomly. Since the relatively high intensity laser beam is applied to the region 12, the temperature of this region rises. Therefore, the temperature of the stripe region and the temperature gradient at the solid-liquid interface satisfy the conditions suitable for forming large crystal grains. It is preferable to set the width W of the region 12 to 15 μm or wider in order to obtain a sufficient crystal grain size increasing effect.

Next, with reference to FIG. 6, description will be made on the relation between a pulse width and a crystal grain size.

Figure 6:
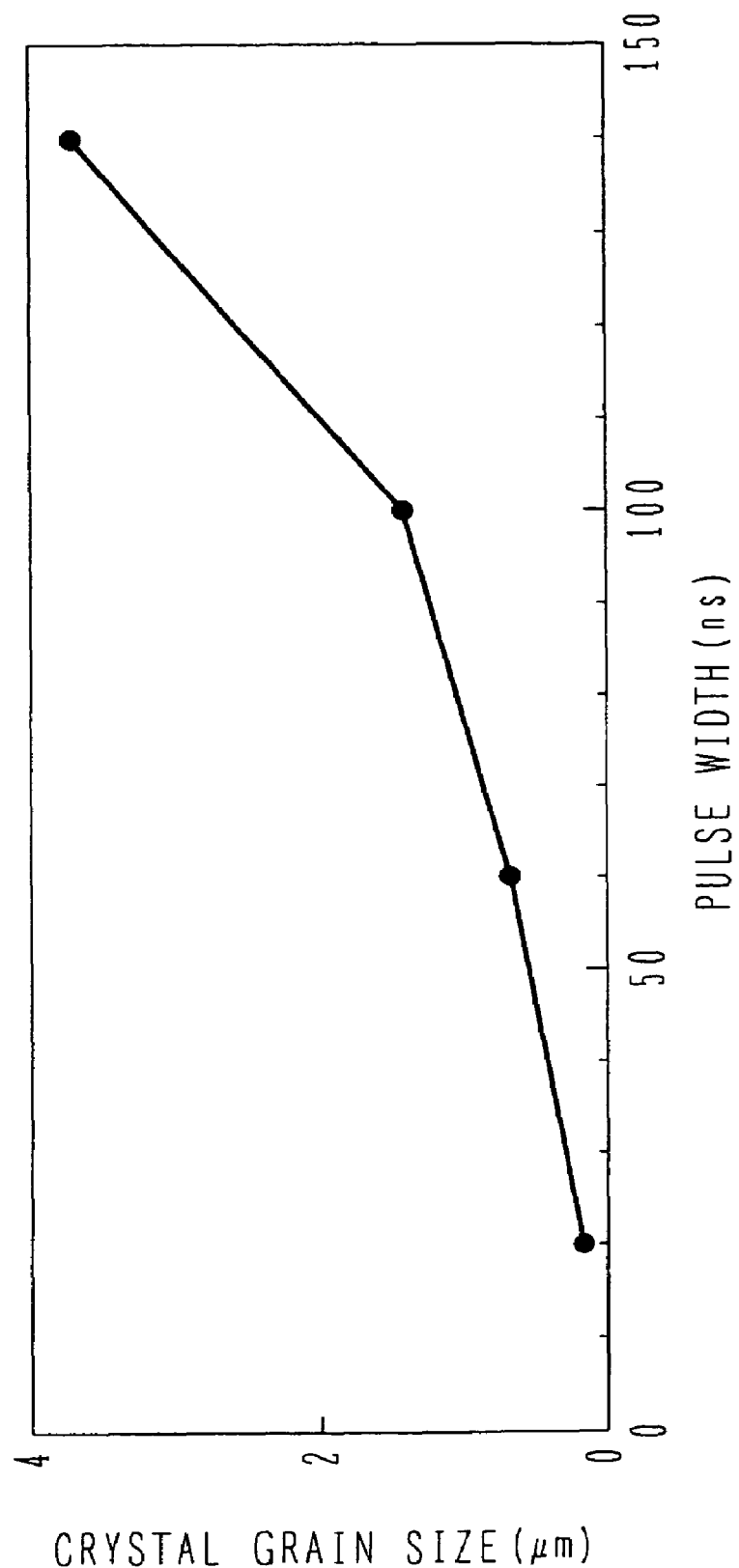
FIG. 6 is a graph showing the relation between a pulse width and a crystal grain size.

FIG. 6 shows the relation between a crystal grain size and a pulse width. The abscissa represents the pulse width in the unit of "ns" and the ordinate represents the crystal grain size in the unit of "μm". The crystal grain size was calculated by using the above-cited crystal grain evaluation program.

The workpiece object and pulse laser beam wavelength are the same as the conditions described with reference to FIG. 5. The beam width on the workpiece object surface was set to 16.7 μm. The simulation method is similar to the method described with reference to FIG. 5.

It can be understood that as the pulse width is broadened, the crystal grain size becomes large. This may be ascribed to that as the pulse width is broadened, the temperature drop becomes gentle so that the melted region is maintained longer at a proper temperature. However, if the pulse width is broadened under the condition of a constant pulse energy, the peak intensity of the pulse laser beam lowers and a sufficient power density cannot be maintained. The upper limit of the pulse width is therefore restricted by the output characteristics of a laser source in use.

If excimer laser is used as the laser source, the pulse width is generally 70 ns or narrower. Generally, a full solid-state laser such as Nd:YLF laser has a pulse width of 20 to 30 ns or 100 ns or broader. In order to form large crystal grains, the laser having a pulse width of 100 ns or broader is preferably used.

The above-described studies have been made paying attention to the distribution profile of the pulse energy density and the pulse width in order to optimize the temperature state of a silicon melting region. The temperature state can also be controlled by applying a second pulse laser beam to the same region before the region melted by the first pulse laser beam is solidified.

Figure 7:
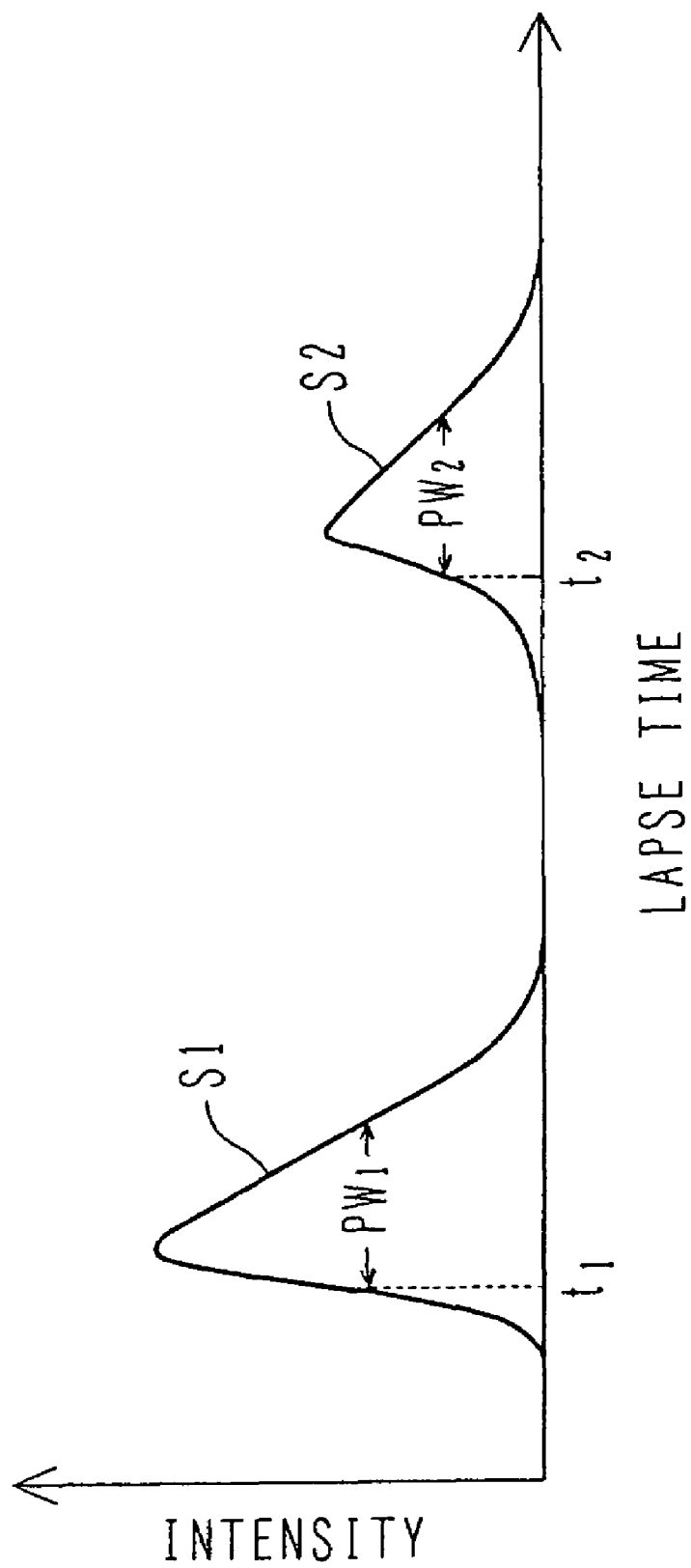
FIG. 7 is a graph showing an example of a laser beam waveform when two shots of a pulse laser beam are applied to the same region.

FIG. 7 shows an example of the waveform of a laser beam applied to a workpiece object. The abscissa represents a lapse time and the ordinate represents an intensity of a laser beam. A pulse laser beam S1 as the first shot is applied at time $t_1$, and a pulse laser beam S2 as the second shot is applied at time $t_2$. The pulse widths (half value widths) of the pulse laser beams of the first and second shots are PW1 and PW2, respectively. In the example shown in FIG. 7, although the peak intensity of the pulse laser beam of the second shot is set lower than that of the pulse laser beam of the first shot, both the peak intensities may be the same.

As the pulse laser beam S1 of the first shot shown in FIG. 7 is applied, an amorphous silicon film is melted. As the temperature lowers, nucleuses are formed so that crystal grains are grown from the nucleuses. Before the temperature lowers to the temperature at which the nucleus formation factor becomes large, the pulse laser beam S2 of the second shot is applied to heat again the same region. The second shot suppresses the nucleus formation so that the crystal growth can continue. Large crystal grains can therefore be formed.

Before the region melted upon incidence of the first shot is completely solidified, the pulse laser beam S2 of the second shot is applied. For example, a delay time of the second shot laser beam incidence from the first shot laser beam incidence is set to about 300 to 1500 ns. If a full solid-state laser is used as a laser source, a delay time can be controlled more easily than using excimer laser. As will be later described, a crystal grain once formed is hard to be melted more than the region in the amorphous phase. Therefore, the crystal grain once formed is hard to be melted again by the second shot pulse laser beam incidence.

For example, the crystal grain size was about 2.1 µm when a pulse beam laser was applied which had the pulse energy density peak value of 1300 mJ/cm$^2$, a pulse width of 140 ns and a beam width of 16.7 µm. In contrast, the crystal grain size was about 4.4 µm after polycrystallization under the conditions of the first shot pulse energy density peak value of 1300 mJ/cm$^2$, the second shot pulse energy peak value of 700 mJ/cm$^2$ and a delay time of 900 ns. The crystal grain can be made large by applying pulse laser beams of two shots with a delay time.

The method of applying the second shot pulse laser beam before the region melted by the first shot pulse laser beam is solidified, is herein called a double pulse method. More in general, the method of applying pulse laser beams of two or more shots before melted silicon is solidified, is herein called a multi pulse method.

The method of the first embodiment does not use a mask for making top flat the intensity distribution of a laser beam. The energy use efficiency of a laser beam can therefore be improved.

With the first embodiment method, a crystal grain column can be formed in which crystal grains frame chains along a first direction. An average size of crystal grains can be set to 1.5 µm or larger along a direction perpendicular to the first direction.

Next, the second embodiment will be described in which crystal grains formed by the first embodiment method are further broadened in the substrate in-plane direction.

FIGS. 8A to 8G are schematic diagrams illustrating how crystal grains are grown. Each of FIGS. 8A to 8G shows the cross section of a silicon film, and the lateral direction of FIGS. 8A to 8G corresponds to the short axis direction of the pulse laser beam in the incidence region.

As shown in FIG. 8A, as a pulse laser beam is applied by the first embodiment method, a number of crystal grains framing chains along the long axis direction (direction perpendicular to the drawing sheet) are formed in two stripe regions 7. Fine crystal grains are formed in a region 8 between the two stripe regions 7. The width of each of the stripe regions 7 is 4 µm for example. As shown in FIGS. 5A and 5B, by optimizing the laser beam incidence conditions, it is possible to form crystal grains having a size of about 4 µm.

FIG. 8B shows a crystallization state after the second shot by moving the laser beam incident position by 15 µm along the short axis direction.

For example, if the beam width is 100 µm and the motion distance is 15 µm, an overlap factor is 85%.

Stripe regions 20 having successive crystal grains are formed at the positions where the stripe regions 7 are moved by 15 µm along the direction of moving the laser beam. The width of the stripe region 20 is 4 µm. Although the amorphous silicon film, fine crystal grains and small crystal grains in the region between the two stripe regions 20 are melted, the large crystal grains in the stripe region 7 are hard to be melted. Actually, although the crystal grains in the stripe region 7 are partially melted, some crystal grains are left as they are. As the temperature lowers, the left crystal grains in the stripe region 7 become seed crystals so that crystal growth occurs.

Assuming that the crystal growth occurs to the same degree as the size of the crystal grains formed by the first shot, the length of the crystal grains grown on both sides of the stripe region 7 is about 4 µm. Therefore, a polycrystalline region 7a having a width of about 12 µm is formed around the stripe region 7 positioned on the forward side in the laser beam motion direction. The width of the fine crystal region 15 between the stripe region 7a and the stripe region 20 positioned on the forward side in the laser beam motion direction is about 7 µm. The amorphous silicon film, fine crystal grains and small crystal grains near the stripe region positioned on the backward side in the laser beam motion direction are not melted so that the crystal growth does not occur.

FIG. 8C shows a crystallization state after the third shot by moving the laser beam incident position further by 15 µm along the short axis direction.

Stripe regions 21 having successive crystal grains are formed at the positions where the stripe regions 20 are moved by 15 µm along the direction of moving the laser beam. The width of the stripe region 21 is 4 µm. Crystal growth further occurs by using as seed crystals the crystal grains in the stripe region 7a and in the stripe region 20 positioned on the forward side in the laser beam motion direction.

Crystal grains having a width of about 4 µm are formed from the stripe region 7a toward the backward side in the motion direction. At the same time, crystal grains having a width of about 4 µm are grown from the stripe region 20 toward the forward side in the laser beam motion direction. In the region 15 between the stripe region 7a and stripe region 20, crystal growth occurs from both sides toward the center. Since the width of the region 15 is about 7 µm, when the crystal growth progresses from the both sides by 3.5 µm, crystal grains collide each other to stop the crystal growth.

In this manner, a stripe region 7b having a width of 19.5 µm including the stripe region 7a is formed, and a stripe region 20a having a width of 11.5 µm including the stripe region 20 is formed. A number of crystal grains framing chains along the long axis direction are formed in the stripe regions 7b and 20a. A crystal grain boundary is formed along the center line 16 of the region 15. Since crystal grains collide each other, a projection like a mountain range is formed at the position of the center line 16.

FIG. 8D shows a crystallization state after the fourth shot by moving the laser beam incident position further by 15 μm along the short axis direction.

A stripe region 22 is formed at the position where the stripe region 21 is moved by 15 μm along the direction of moving the laser beam. By using as seed crystals the crystal grains in the stripe region 20a, crystals are grown in the front region along the direction of moving the laser beam, and by using as seed crystals the crystal grains in the stripe region 21, crystals are grown on both sides of the strip region. Therefore, a strip region 20a having a width of 15 μm and a stripe region 21a having a width of 11.5 μm are formed.

FIGS. 8E to 8G show a crystallization state after the fifth to seventh shots by moving the laser beam incident position by 15 μm each time along the short axis direction.

The fifth shot forms a new stripe region 23 and at the same time broadens the stripe regions 21a and 22 to form stripe regions 21b and 22a. The sixth shot broadens the stripe regions 22a and 23 to form stripe regions 22b and 23a. The seventh shot broadens the stripe region 23a to form a stripe region 23b.

In this manner, by repeating shots while the laser beam incident position is moved each time along the short axis direction, almost the whole of the amorphous silicon film can be polycrystallized.

Figure 9:
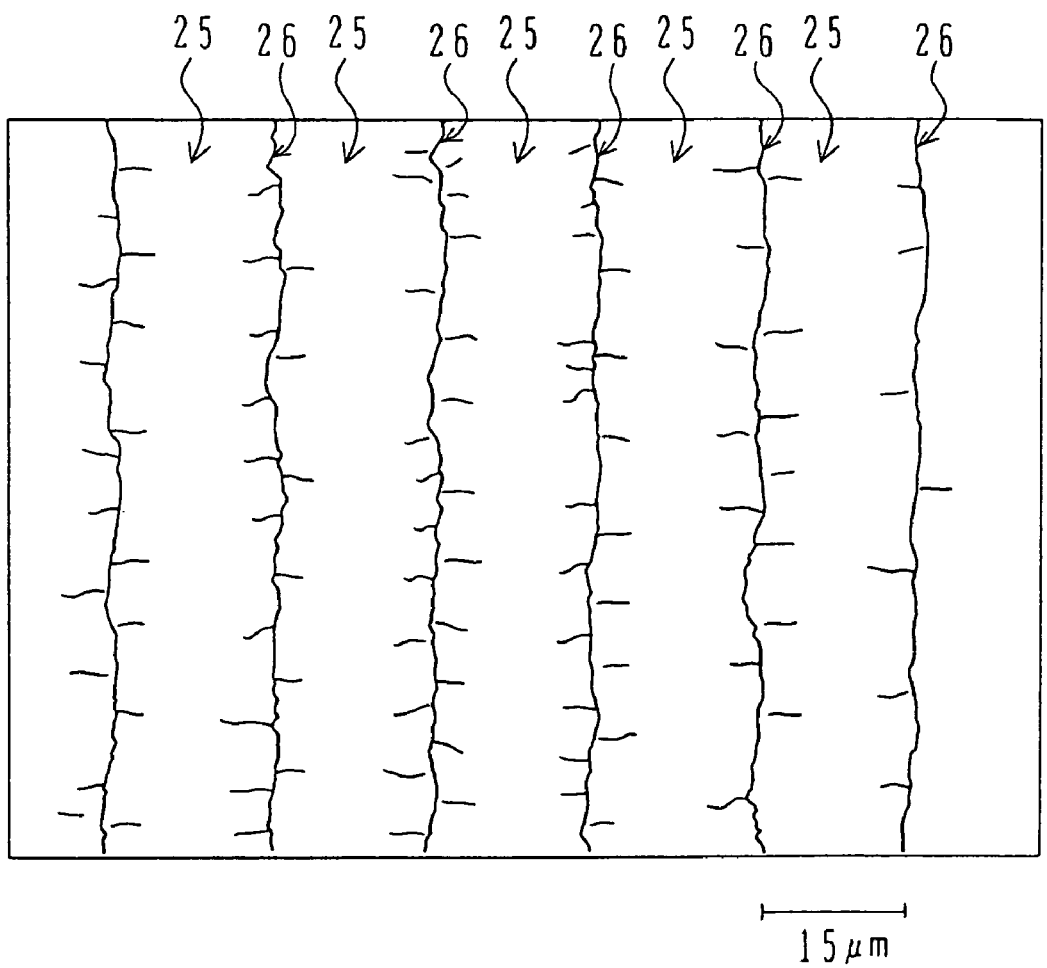
FIG. 9 is a diagram sketched from a SEM photograph of a polycrystalline film manufactured by the second embodiment method.

FIG. 9 is a diagram sketched from a SEM photograph of a polycrystalline film formed by the method illustrated in FIGS. 8A to 8G. A plurality of stripe regions 25 can be observed. The width of each stripe region 25 is about 15 μm, and a number of crystal grains framing chains along the long axis direction are formed in the stripe regions 25. A projection 26 like a mountain range is formed at the border between adjacent stripe regions 25.

Next, with reference to FIG. 10, the conditions of polycrystallizing the whole amorphous silicon film will be described. As the overlap factor is reduced when the pulse laser incident position is moved, the width of the fine crystal region 15 shown in FIG. 8B is widened. In this case, the laser beam incidence region goes out of the region 15 before crystal grains grown from both sides of the region collide each other. Further, even if the overlap factor is maintained constant, the same phenomenon occurs if the length of the crystal growth per shot becomes short. Therefore, if the length of the crystal growth per shot is short, the overlap factor is required to be high.

Figure 10:
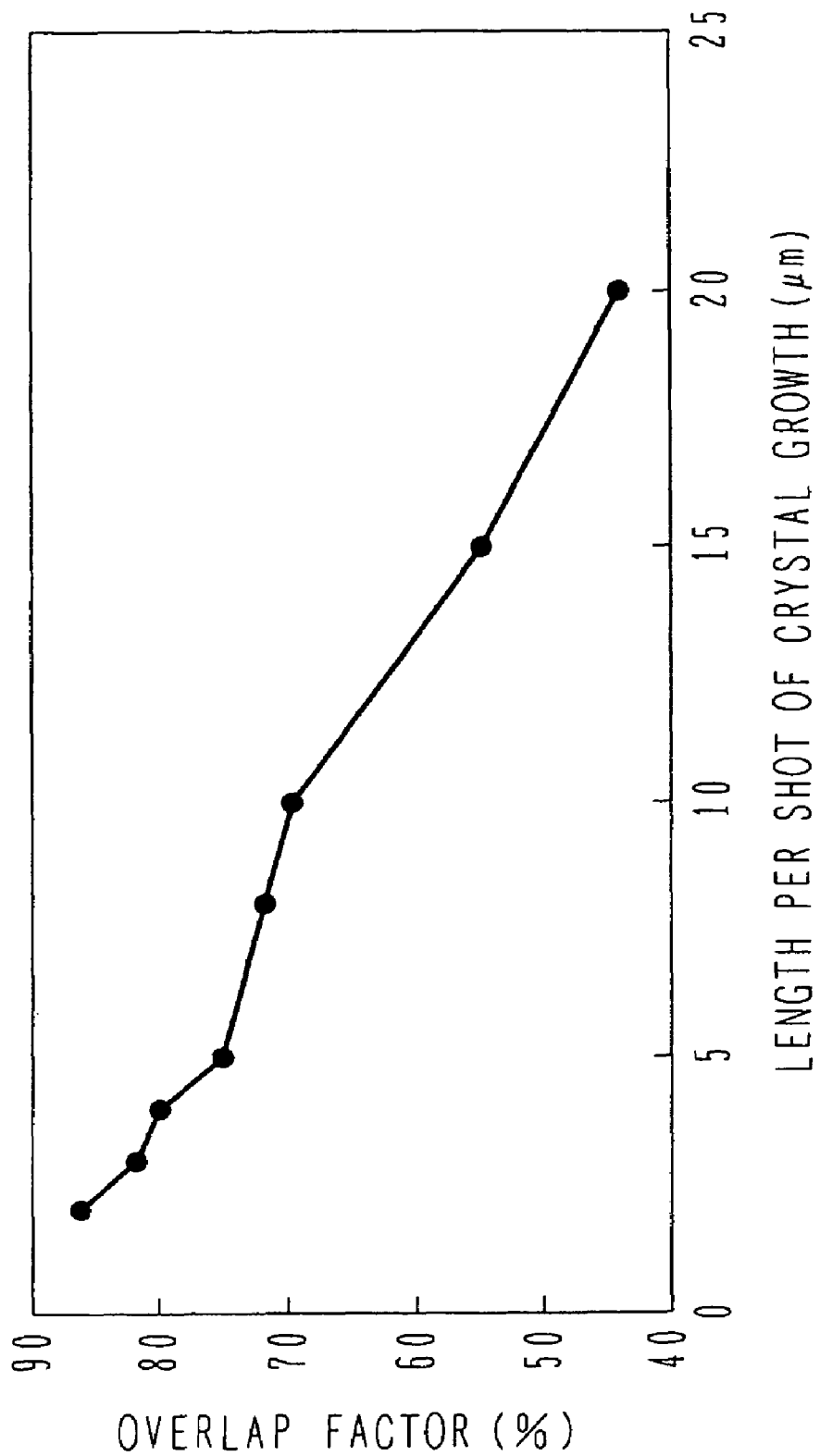
FIG. 10 is a graph showing the relation between a length of crystal growth per shot and an overlap factor necessary for polycrystallizing the whole region.

FIG. 10 shows the relation between a length of the crystal growth per shot and a necessary overlap factor. The abscissa represents the length of the crystal growth per shot in the unit of "μm" and the ordinate represents the overlap factor in the unit of "%". For example, if the length of the crystal growth per shot is 10 μm, the overlap factor is set to 70% or higher. It can be understood that as the length of the crystal growth per shot becomes short, the overlap factor necessary for polycrystallizing the whole amorphous silicon film becomes high.

In order to polycrystallize the whole amorphous silicon film, the overlap factor is set in such a manner that the center line 16 of the fine crystal region 15 remains in the silicon melting region by the laser beam incidence until the crystal grains grown from both sides of the fine crystal region 15 shown in FIG. 8B collide each other.

Next, with reference to FIG. 11, description will be made on a preferred wavelength of a laser beam used for polycrystallizing an amorphous silicon film.

FIG. 11 shows the wavelength dependency of light absorption coefficients of amorphous silicon and single crystal silicon. The abscissa represents the wavelength in the unit of "nm" and the ordinate represents the absorption coefficient in the unit of "×10$^7$ cm$^{-1}$". A black circle and a white circle in FIG. 11 indicate the absorption coefficient of single crystal and the absorption coefficient of amorphous silicon.

It can be seen that the absorption coefficient of amorphous silicon is larger than that of single crystal silicon in the range of the wavelength equal to and longer than about 340 nm. In the range from the wavelength of 400 nm to the wavelength 600 nm among other ranges, the absorption coefficient of amorphous silicon is larger by one digit or more than that of single crystal silicon. If crystal grains once formed are used as seed crystals for crystal growth, it is preferable that the amorphous region is melted without melting crystal grains. The region in which actually formed crystal grains are distributed is not single crystal but amorphous silicon. The absorption coefficient of polycrystalline silicon depends on the size of crystal grains and has a value at the middle of those of single crystal and amorphous silicon. As the grain size becomes large, the absorption coefficient of polycrystalline silicon becomes near that of single crystal, whereas as the grain size becomes small, the absorption coefficient of polycrystalline silicon becomes near that of amorphous silicon.

Therefore, it is preferable to use a pulse laser beam having a wavelength equal to or longer than 340 nm, in order to preferentially melt the amorphous region 9, randomly distributed region 12 and fine crystal region 8 shown in FIG. 2B without melting large crystal grains in the stripe regions 7. Since the absorption coefficient lowers if the wavelength is too long, it is preferable to use a pulse laser having a wavelength of 900 nm or shorter.

In the wavelength range (about 308 nm) of excimer laser, the absorption coefficient of amorphous silicon is higher than that in the wave length range of 340 to 900 nm. Therefore, absorption occurs only in the surface layer of an amorphous silicon film and a temperature gradient occurs in the thickness direction. If a laser beam in the wavelength range of 340 to 900 nm is used, the laser beam enters to a relatively deep region of the amorphous silicon film so that the film can be heated uniformly in the thickness direction. Crystals having a better quality can therefore be formed.

Next, with reference to FIGS. 12A and 12B, description will be made on a polycrystalline film manufacture method of the third embodiment.

Figure 12A:
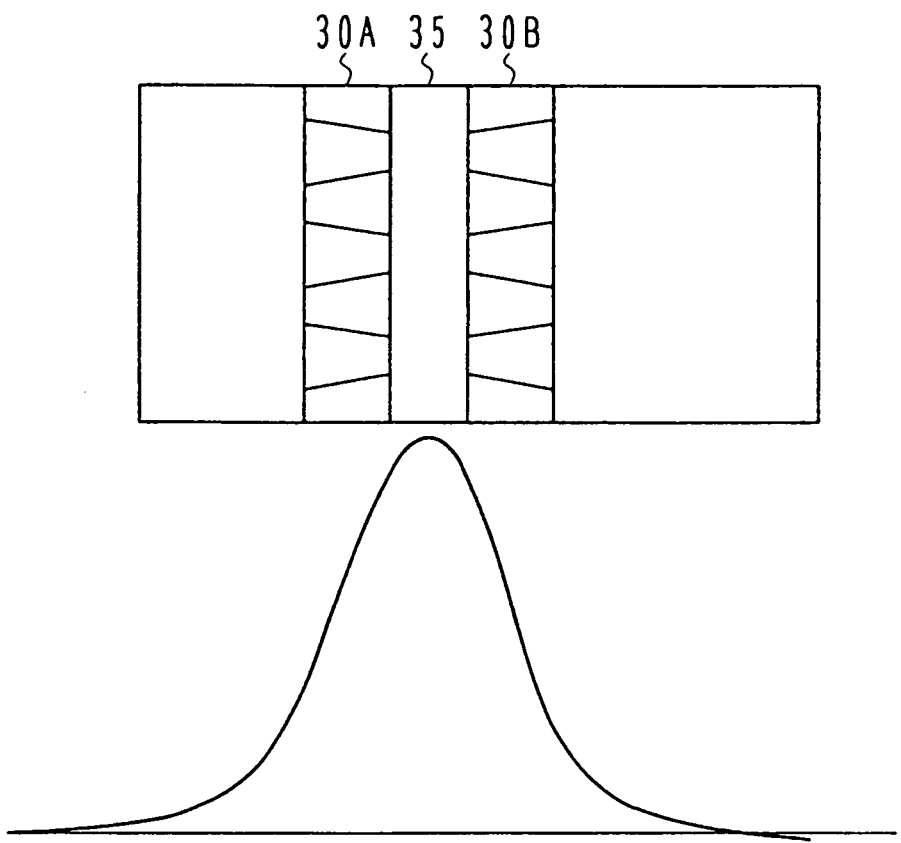
FIG. 12A is a diagram showing the relation between a polycrystallized region and a pulse energy density distribution of a pulse laser beam used by a polycrystalline film manufacture method according to the third embodiment.

FIG. 12A shows the relation between a polycrystallized region and a pulse energy density distribution of an applied laser beam along the short axis direction. Fine crystals are formed in a region 35 where the laser beam having the highest pulse energy density is applied. Stripe regions 30A and 30B having large crystal grains framing chains along the long axis direction are formed on both sides of the region 35. The beam width is set so that the width of the fine crystal grain region 35 is approximately equal to that of each of the stripe regions 30A and 30B.

Laser irradiation of the second shot is performed by moving the laser incident position by a distance equal to the width of the stripe region 30A along the short axis direction.

Figure 12B:
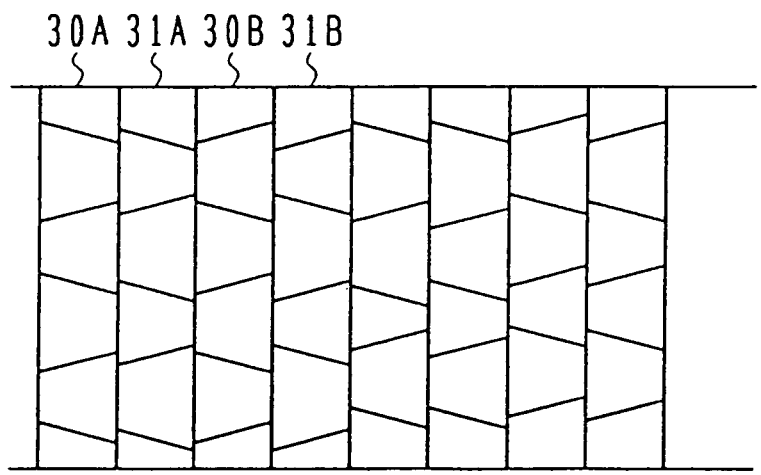
FIG. 12B is a schematic plan view of a manufactured polycrystalline film.

As shown in FIG. 12B, a stripe region 31A having large crystal grains framing chain are formed between the stripe regions 30A and 30B already formed with crystal grains. At the same time, a stripe region 31B is formed on the front side of the stripe region 30B positioned on the forward side in the laser beam motion direction.

In this manner, four stripe regions 30A, 31A, 30B and 31B are formed by two shots of the laser beam. The crystal grains in the adjacent stripe regions are in contact with each other. By repeating similar processes, the whole region of the film can be polycrystallized.

Depending upon the temperature conditions, crystal growth may occur by using as seed crystals the crystal grains in the stripe regions 30A and 30B instead of the growth of crystal grains from nuclei formed in the region 35 shown in FIG. 12A.

Next, with reference to FIGS. 13A and 13B, description will be made on a polycrystalline film manufacture method of the fourth embodiment.

Figure 13A:
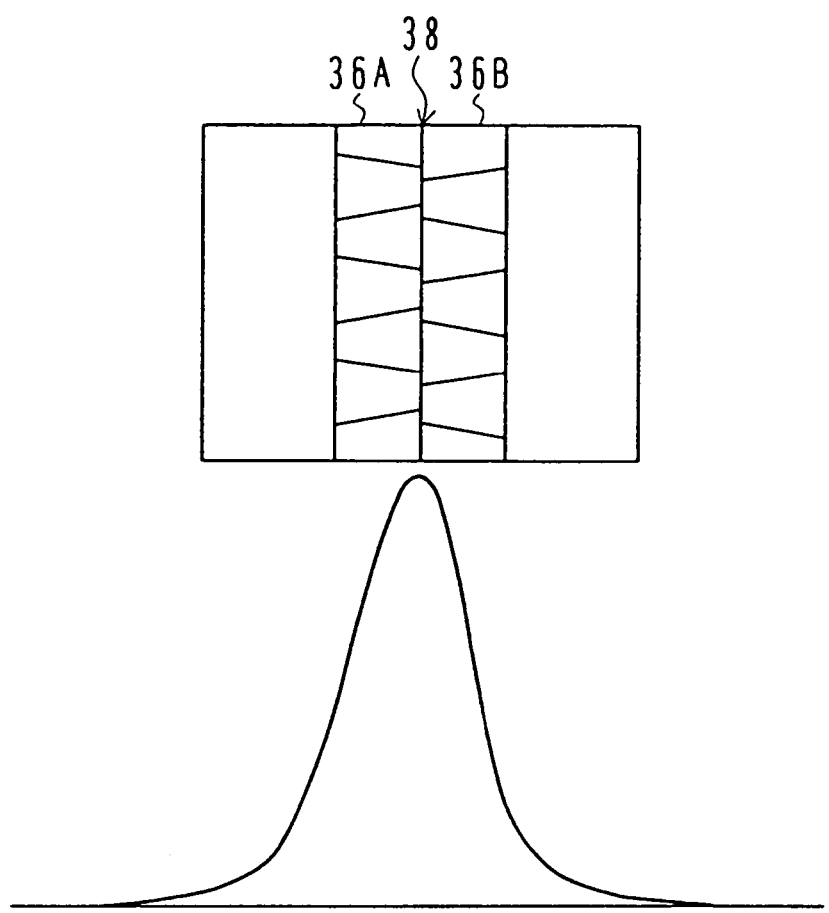
FIG. 13A is a diagram showing the relation between a polycrystallized region and a pulse energy density distribution of a pulse laser beam used by a polycrystalline film manufacture method according to the fourth embodiment.

FIG. 13A shows the relation between a polycrystallized region and a pulse energy density distribution of an applied laser beam along the short axis direction. Stripe regions 36A and 36B having large crystal grains framing chains along the long axis direction are formed on both sides of the position at which the pulse energy density takes the maximum value. Since the beam width is narrow, the crystal grains formed from nuclei in the stripe region 36A are in contact with the crystal grains formed from nuclei in the stripe region 36B. A crystal grain boundary is disposed along the contact line 38.

Laser irradiation of the second shot is performed by moving the laser incident position by a distance corresponding to the total width of the stripe regions 36A and 36B along the short axis direction.

Figure 13B:
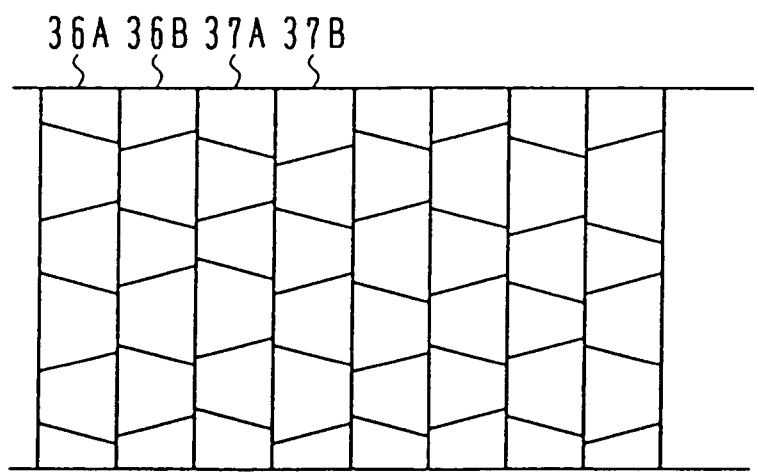
FIG. 13B is a schematic plan view of a manufactured polycrystalline film.

As shown in FIG. 13B, stripe regions 37A and 37B in contact with each other are formed. The stripe region 37A positioned on the backward side in the laser beam motion direction contacts the stripe region 36B formed by the first shot and positioned on the forward side in the laser beam motion direction. By repeating similar processes, the whole region of the film can be polycrystallized.

In the third and fourth embodiments, if the pulse energy density distribution of the pulse laser beam to be irradiated is shaped to have the proper shape described with reference to the first embodiment, large crystal grains can be formed. Further, as shown in FIG. 7, if the pulse laser beams of two shots are applied to the same region, crystal grains can be made larger.

Next, with reference to FIG. 14 and FIGS. 15A to 15C, description will be made on a polycrystalline film manufacture method of the fifth embodiment.

Figure 14:
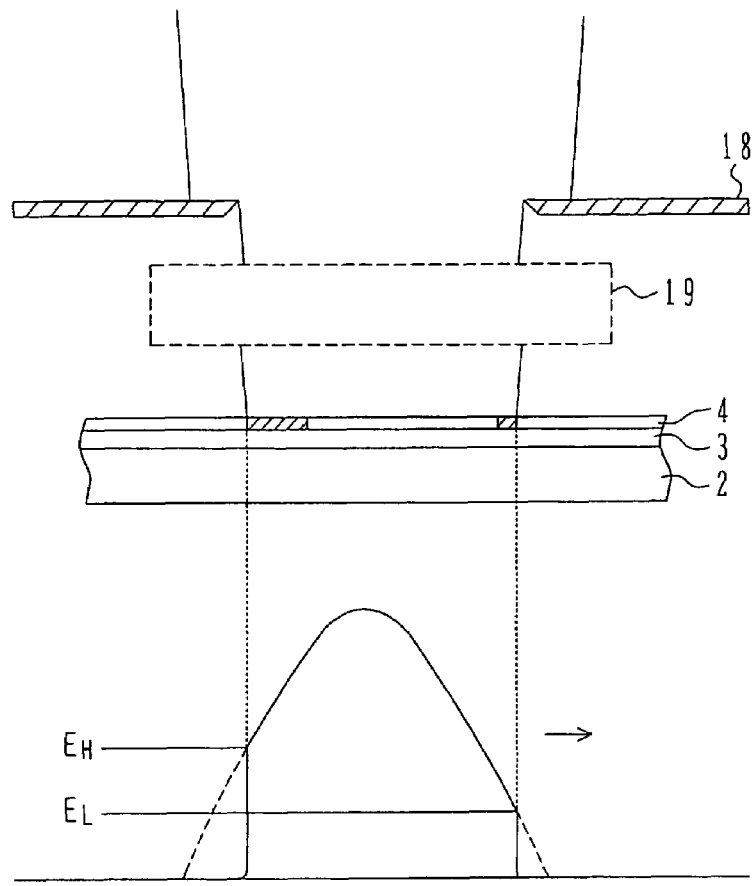
FIG. 14 is a cross sectional view of a workpiece object substrate and a light shielding plate used by a polycrystalline film manufacture method according to the fifth embodiment and a graph showing a pulse energy density distribution.

FIG. 14 shows a cross sectional view of a workpiece object 1 near the laser beam incidence position and an example of the distribution of a pulse energy density along the short axis direction of the beam cross section. The pulse energy density is generally obtained by dividing the pulse energy by an area of the beam cross section. Strictly speaking, the pulse energy density obtained by this calculation is an average value in the beam cross section. Since the light intensity in the beam cross section is not uniform, the pulse energy density is also not uniform. If the light intensity distribution is approximated by the Gaussian distribution, the pulse energy density distribution is also approximated by the Gaussian distribution.

As shown in FIG. 14, similar to the first embodiment described with reference to FIG. 2A, the workpiece object is a laminated substrate having a silicon oxide film 3 and an amorphous silicon film 4 formed on a glass substrate 2. The incidence position of the pulse laser beam moves right as viewed in FIG. 14.

A portion of a laser beam passed through the homogenizer 72 shown in FIG. 1 is intercepted by a light shielding plate 18, and the remaining portion of the laser beam becomes incident upon the amorphous silicon film 4 via an optical focusing system 19. The light shielding plate 18 intercepts the light at the skirt portions of the pulse energy density distribution along the short axis direction of the beam cross section. The optical focusing system 19 focuses the beam cross section at the position where the light shielding plate 18 is disposed, upon the surface of the amorphous silicon film 4. A focusing magnification factor is, for example, 1.

If the light shielding plate 18 is not used, the pulse energy density distribution along the short axis direction of the pulse beam laser on the surface of the amorphous silicon film 4 is approximated by the Gaussian distribution. Namely, the pulse energy density distribution is dense in the central area and weakens toward the borders. The pulse energy density distribution is not necessarily required to have the Gaussian distribution, but it may be the general distribution that the density is dense in the central area and weakens toward the borders.

The light shielding plate 18 intercepts a portion of a pulse laser beam equal to or lower than the pulse energy density of $E_H$ in the skirt portion on the backward side in the motion direction of the incidence position of the laser beam. On the forward side, a portion of the pulse laser beam equal to or lower than the pulse energy density of $E_L$ is light-shielded. The pulse energy density $E_L$ is lower than $E_H$. In an actual case, the light intensity does not become 0 just at the borders of the cross section of the beam intercepted by the light shielding plate 18, but the beam cross section broadens outward by about 6 μm from the intercepted position. The borders of the beam cross section were defined as the position at which the light intensity takes a value of 20% of the peak value.

One shot of a pulse laser beam having such a pulse energy density distribution is applied to the amorphous silicon film 4. The amorphous silicon film 4 is melted in the region to which applied is a portion of the laser beam having the pulse density equal to or larger than the threshold value completely melting the amorphous silicon film. If the pulse energy density $E_L$ is equal to or larger than this threshold value, the whole region where the pulse laser beam is applied is melted. While the melted region is cooled, crystals are grown from the borders of the melted region into the inner sides.

Figure 15A:
FIGS. 15A to 15C are schematic diagrams illustrating how polycrystallization progresses by the polycrystalline film manufacture method of the fifth embodiment.

As shown in FIG. 15A, a number of crystal grains 100a disposed along the long axis direction of the beam cross section are formed along the border on the backward side in the motion direction of the incidence position of the pulse laser beam, and along the border on the forward side, a number of crystal grains 101a are formed. In the region between the region formed with the crystal grains 100a and the region formed with the crystal grains 101a, fine crystal grains are formed similar to the region 8 shown in FIG. 3. The length of a grown crystal grain is dependent upon the temperature of the melted region and the temperature gradient at the solid-liquid interface. The temperature and temperature gradient at the border on the backward side are different from those at the border on the forward side. The lengths of crystal grains grown from both borders of the melted regions are therefore different.

If the temperature and temperature gradient at the border on the backward side satisfy the conditions suitable for crystal growth, the crystal grains 100a formed at the border on the backward side are larger than the crystal grains 101a formed at the border on the forward side. For example, the lateral size of the crystal grain 100a formed at the border on the backward side was able to be set to 7 to 8 μm.

Next, another shot of a pulse laser beam is applied by moving the incidence position of the pulse laser beam along the short axis direction of the beam cross section. A motion distance of the incidence position is set so that the border of the second shot laser beam on the backward side of the beam cross section contacts or overlaps the crystal grains 100a. The crystal grains 101a formed at the forward side border by the first shot are melted by the second shot.

Figure 15B:
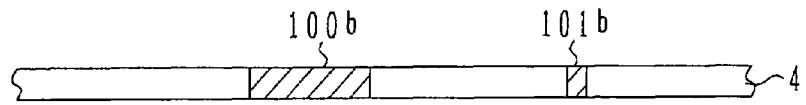

As shown in FIG. 15B, at the backward side border of the region melted by the second shot, crystals are laterally grown by using as seed crystals the crystal grains 100a to form large crystal grains 100b including the crystal grains 100a. If the backward side border of the beam cross section of the second shot pulse laser beam contacts the crystal grains 100a, the lateral size of the crystal grain 100b is 14 to 16 µm which is about a twofold of the size of the crystal grain 100a.

Pulse laser beam irradiation is repeated by moving the incidence position of the pulse laser beam so as to make the region applied with a preceding shot partially overlap the region applied with a succeeding shot. The motion distance is set so that the backward side border of the beam cross section of the pulse laser beam of the succeeding shot contacts or overlaps the backward side crystal grains formed by the pulse laser beam of the preceding shot.

Figure 15C:

As shown in FIG. 15C, crystal grains are laterally grown to form large crystal grains 100c. The small crystal grains 101b shown in FIG. 15B formed at the forward side border of the beam cross section are melted and extinguished by the succeeding shot of the pulse laser beam.

In the fifth embodiment, crystals are grown from the backward side border of the beam cross section defined by the light shielding plate 18. In the first embodiment, the stripe region 7 formed with large crystal grains has a zigzag shape as shown in FIG. 3. In the fifth embodiment, the region where the crystal grains 100a are formed is artificially determined by the light shielding plate 18, has generally a straight-line shape and the stripe region with the successive crystal grains 100a does not have the zigzag shape. Therefore, the pulse laser beam of the second shot can be easily positioned so that the backward side border of the beam cross section contacts the stripe region with the successive crystal grains 100a.

Furthermore, the crystal growth direction can be aligned with the direction perpendicular to the long axis of the beam cross section. When active elements are formed on the polycrystalline film, the current direction of the active element is made parallel to the crystal growth direction so that it is possible to suppress the carrier mobility from being lowered by crystal grain boundaries.

In this embodiment, the incidence position is moved each time one shot of a pulse laser beam is applied. As described with reference to FIG. 7, the double pulse method may be adopted to apply two shots of the pulse laser beam to the same region. With this method, the size of crystal grains can be made large.

The preferred regions of the skirt portions of the pulse energy density distribution shown in FIG. 14 to be light-shielded, i.e., the preferred values of the pulse energy densities $E_H$ and $E_L$, can be determined by a plurality of evaluation experiments at different light shielding region sizes (widths).

In the following, the evaluation experiments actually conducted will be described. A laser beam output from a laser source was shaped to an elongated beam having the beam cross section of 100 µm wide and 17 mm long. Both sides of the beam cross section were light-shielded by a light shielding plate to form a cross section having a width of 22 µm, and this cross section of the beam was focused on the surface of an amorphous silicon film. The width of the beam cross section corresponds to the half value width of the light intensity distribution.

The double pulse method was adopted under the conditions that two laser sources were used, the pulse energy densities of first and second shot pulse laser beams were set to 550 mJ/cm² and 500 mJ/cm², respectively, and the delay time was set to 100 ns.

Under these conditions, two shots of the pulse laser beams were applied and the width of the crystal grain 100a formed on the scan direction backward side of the beam cross section was 3.1 µm. By scanning the surface of the amorphous silicon film with the pulse laser beams at a pitch of 3 µm, crystals were able to be grown continuously crystallographically along the scanning direction such as shown in FIG. 15C. Orientations of crystal grains were measured. The <110> direction of each crystal grain was in alignment with the direction parallel to the crystal growth direction (scanning direction).

Next, with reference to FIG. 16 and FIGS. 17A to 17C, description will be made on a polycrystalline film manufacture method of the sixth embodiment.

Figure 16:
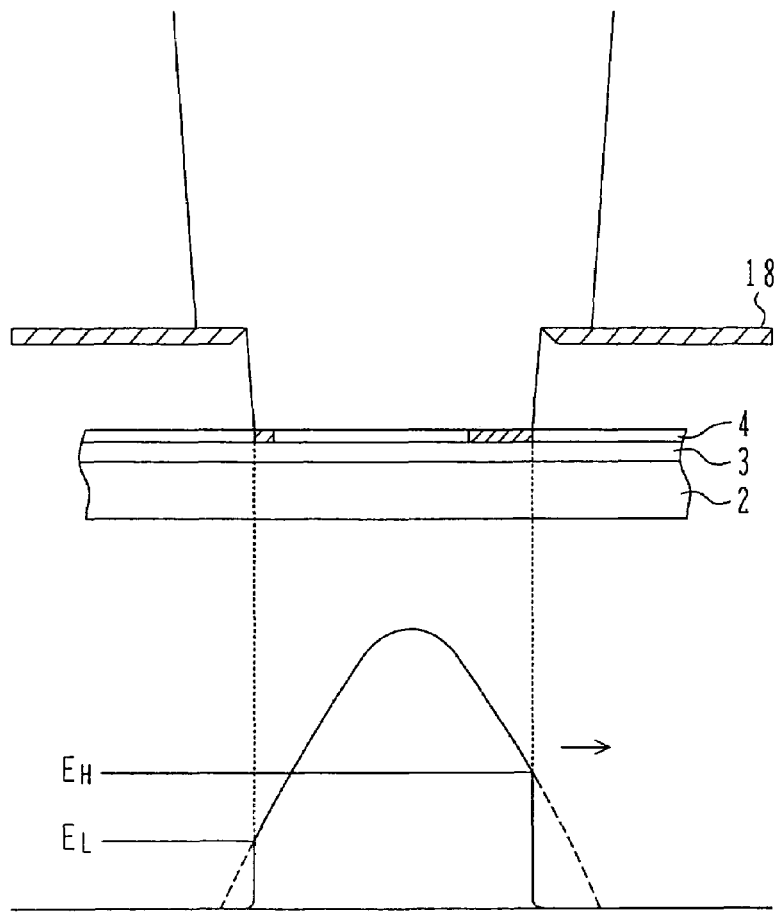
FIG. 16 is a cross sectional view of a workpiece object substrate and a light shielding plate used by a polycrystalline film manufacture method according to the sixth embodiment and a graph showing a pulse energy density distribution.

As shown in FIG. 16, in the sixth embodiment, on the forward side in the motion direction of the incidence position of a pulse laser beam, a portion of the skirt equal to or lower than the pulse energy density of $E_H$ is intercepted by a light shielding plate 18, and on the backward side, a portion of the skirt equal to or lower than the pulse energy density of $E_{EL}$ is intercepted by the light shielding plate 18.

Figure 17A:
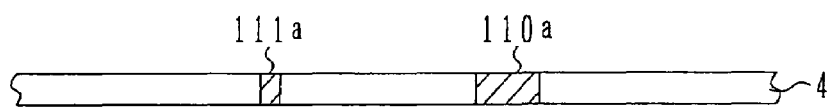
FIGS. 17A to 17C are schematic diagrams illustrating how polycrystallization progresses by the polycrystalline film manufacture method of the sixth embodiment.

As shown in FIG. 17A, with one shot irradiation, relatively large crystal grains 110a are formed at the border on the forward side of the beam cross section, and relatively small crystal grains 111a are formed at the border on the backward side.

Figure 17B:
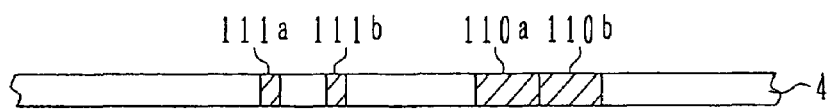

As shown in FIG. 17B, as another shot is performed by moving the incidence position of the pulse laser beam, crystal grains 110b and 111b are formed. Since the relatively large crystal grains 110a are hard to be melted, they are hardly melted by the next and following shots. The crystal grains 110b are grown from the border on the forward side of the melted region toward the backward side (toward the crystal grains 110a side). The crystal growth stops when the top of the crystal growth reaches the crystal grains 110a.

In this case, the lateral crystal growth occurs by using as seed crystals the already formed crystal grains 110a. Therefore, the motion pitch of the incidence position of the pulse laser beam can be made longer than the width of the crystal grain 110a.

Figure 17C:
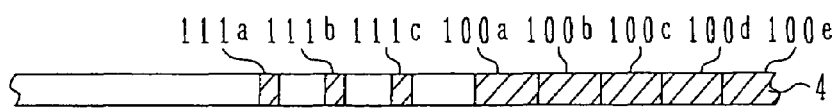

As shown in FIG. 17C, pulse laser beam irradiation is repeated by moving the incidence position of the pulse laser beam to form relatively large crystal grains 110a to 110e. In FIG. 17C, the third shot forms relatively small crystal grains 111c at the border on the backward side of the beam cross section. At the fourth and following shots, since the border on the backward side of the beam cross section is positioned inside the relatively large crystal grains 110a to 110e, a melted region is not formed near the border on the backward side.

In the sixth embodiment, as shown in FIG. 17C, for example, a clear boundary is formed between the stripe region with the successive crystal grains 110a and the stripe region with the successive crystal grains 110b. The position of this boundary can be determined artificially by using the light shielding plate 18. For example, when active elements are formed on the polycrystalline silicon film, it is possible to dispose the crystal grain boundaries so as not to make the active element override the crystal grain boundary. In the above manner, the whole substrate surface can be covered with the stripe regions as shown in FIG. 9.

In the following, the evaluation experiments actually conducted will be described. A laser beam output from a laser source was shaped to an elongated beam having the beam cross section of 100 µm wide and 17 mm long. The border of the beam cross section on the forward side in the scanning direction was light-shielded by a light shielding plate to form a cross section having a width of 55 µm, and this cross section of the beam was focused on the surface of an amorphous silicon film. The double pulse method was adopted under the conditions that two laser sources were used, the pulse energy densities of first and second shot pulse laser beams were set to 710 mJ/cm$^2$ and 640 mJ/cm$^2$, respectively, and the delay time was set to 200 ns.

Under these conditions, two shots of the pulse laser beams were applied and the width of the crystal grain 110a formed on the scan direction forward side of the beam cross section was 5.4 µm. By scanning the surface of the amorphous silicon film with the pulse laser beams at a pitch of 12 µm, the stripe region having a width of 12 µm and crystal grains framing chain in the long axis direction of the beam cross section were formed. Crystal grains in the adjacent stripe regions contacted at the boundary of the stripe regions and the whole region was able to be polycrystallized.

Although the width of the crystal grains 110a formed by one shot is 5.4 µm, the width of the stripe region finally formed is 12 µm. This can be ascribed to that by using as seed crystals the crystal grains having the width of 5.4 µm and formed by one shot, the lateral crystal growth occurs by the succeeding shot. This crystal growth process is similar to the crystal growth process described with reference to FIGS. 8A to 8G.

In the evaluation experiments for the fifth and sixth embodiments, the double shot method is adopted. It is preferable to set the delay time to 100 to 1000 ns from incidence of the first shot pulse laser beam to incidence of the second shot pulse laser beam. This preferable delay time is slightly shorter than when the light shielding plate is not used. This is because the gradient of the light intensity distribution is steep on both sides of the beam cross section and the solidification velocity is faster than when the light shielding plate is not used.

Next, the seventh embodiment will be described. In the fifth and sixth embodiments, portions of the laser beam are intercepted by the light shielding plate so as to make the light intensity distribution (or pulse energy density distribution) asymmetric relative to the width direction of the beam cross section. The laser beam may be intercepted so as to make the light intensity distribution symmetrical. With the symmetric light intensity distribution, crystal grains having almost the same size can be formed at the borders on the forward and backward sides in the scanning direction. Therefore, the amorphous silicon film can be polycrystallized by the method similar to those of the second embodiment described with reference to FIGS. 8A to 8G, the third embodiment described with reference to FIGS. 12A and 12B and the fourth embodiment described with reference to FIGS. 13A and 13B.

In the fifth to seventh embodiments described above, although the beam cross section at the position of the light shielding plate is focused on the surface of the amorphous silicon film, the light shielding plate may be disposed near the amorphous silicon film. The distance between the light shielding plate and amorphous silicon film may be about 0.1 mm.

In the fifth to sixth embodiments, although portions of the laser beam are intercepted by the light shielding plate to form a laser beam having a light intensity distribution asymmetric relative to the width direction of the beam cross section, an asymmetric light intensity distribution may be formed by other optical systems. For example, a gradation filter may be inserted in an optical path, which has a dot pattern of chromium (Cr) or the like formed on the surface of quartz glass.

The present invention has been described in connection with the preferred embodiments. The invention is not limited only to the above embodiments. It will be apparent to those skilled in the art that various modifications, improvements, combinations, and the like can be made.

The invention claimed is:

1. A polycrystalline film manufacture method comprising steps of:
   (a) preparing a workpiece object having a thin film formed on a surface of the workpiece object and made of amorphous material;
   (b) applying at least one shot of a pulse laser beam to the thin film, the pulse laser beam having an elongated beam cross section along one direction on a surface of the thin film and having a light intensity distribution along a short axis of a beam cross section which distribution has an asymmetric first shape that the light intensity distribution is strong in a central area and weakens toward borders;
   (c) moving at least one of an incidence position of the pulse laser beam and the workpiece object in such a manner that the incidence position of the pulse laser beam moves along a direction crossing a long axis direction of the beam cross section of the pulse laser beam, on the surface of the thin film, and that a region applied with one shot of the pulse laser beam partially overlaps a region applied with a preceding one shot of the pulse laser beam;
   (d) applying at least one shot of the pulse laser beam to the thin film, the pulse laser beam having the light intensity distribution of the asymmetric first shape; and
   (e) repeating the step (c) and the step (d) alternately.

2. A polycrystalline film manufacture method according to claim 1, wherein in the step (b), the pulse laser beam is obtained by light-shielding a portion of a first skirt equal to or weaker than a first light intensity with a mask, of the light intensity distribution along the short axis of the beam cross section which distribution has a shape that the light intensity distribution is strong in the central area and weakens toward the borders, and not light-shielding a portion of a second skirt or light-shielding a portion of the second skirt equal to or weaker than a second light intensity, which is weaker than the first light intensity.

3. A polycrystalline film manufacture method according to claim 2, wherein:
   in the step (b) a plurality of crystal grains framing a chain along the long axis direction of the beam cross section are grown by some length from the border of the beam cross section on the side of the first skirt toward an inside of the beam cross section;
   in the step (c) the incidence position of the pulse laser beam undergoes a relative motion on the thin film, with the second skirt of the beam cross section being directed to a forward side of a motion direction, and a motion distance is such a distance as the border of the beam cross section on the first skirt side comes in contact with or overlaps the crystal grains grown from the border of the first skirt side of the beam cross section by a preceding shot; and
   in the step (d) by using as seed crystals the crystal grains grown by the preceding shot, crystals are grown from the seed crystals toward the inside of the beam cross section.

4. A polycrystalline film manufacture method according to claim 2, wherein:

in the step (b) a plurality of crystal grains are formed by growing by some length from the border of the beam cross section on the side of the first skirt toward an inside of the beam cross section, the crystal grains framing chain along the long axis direction of the beam cross section;

in the step (c) the incidence position of the pulse laser beam moves on the thin film, with the first skirt of the beam cross section being directed to a forward side of a motion direction; and a pulse energy density, on a surface of the thin film, of the pulse laser beam applied in the step (d) is such a density as the crystal grains formed on the first skirt side by the previous shots are not melted again, and a plurality of crystal grains framing chain along the long axis direction of the beam cross section are formed by growing by some length from the border of the beam cross section on the side of the first skirt toward an inside of the beam cross section.

5. A polycrystalline film manufacture method according to claim 4, wherein a motion distance of the incidence position of the pulse laser beam in the step (c) is such a distance as the crystal grains grown in the step (d) comes in contact with the crystal grains grown by a preceding shot.

6. A polycrystalline film manufacture method comprising steps of:

(a) preparing a workpiece object having a thin film formed on a surface of the workpiece object and made of amorphous material;

(b) applying at least one shot of a pulse laser beam to the thin film, the pulse laser beam having an elongated beam cross section along one direction on a surface of the thin film and having a light intensity distribution along a short axis of a beam cross section which distribution has a first shape that is obtained by light-shielding with a mask at least a first skirt portion of the light intensity distribution which is strong in a central area and weakens toward borders;

(c) moving at least one of an incidence position of the pulse laser beam and the workpiece object in such a manner that the incidence position of the pulse laser beam moves along a direction crossing a long axis direction of the beam cross section of the pulse laser beam, on the surface of the thin film, and that a region applied with one shot of the pulse laser beam partially overlaps a region applied with a preceding one shot of the pulse laser beam;

(d) applying at least one shot of the pulse laser beam to the thin film, the pulse laser beam having the light intensity distribution of the first shape; and (e) repeating the step (c) and the step (d) alternately.

* * * * *